United States Patent
Fujinami et al.

(10) Patent No.: US 10,338,984 B2
(45) Date of Patent: Jul. 2, 2019

(54) STORAGE CONTROL APPARATUS, STORAGE APPARATUS, AND STORAGE CONTROL METHOD

(71) Applicant: SONY CORPORATION, Tokyo (JP)

(72) Inventors: Yasushi Fujinami, Tokyo (JP); Kenichi Nakanishi, Tokyo (JP); Tsunenori Shiimoto, Kanagawa (JP); Tetsuya Yamamoto, Kanagawa (JP); Tatsuo Shinbashi, Tokyo (JP); Hideaki Okubo, Saitama (JP); Haruhiko Terada, Kanagawa (JP); Ken Ishii, Tokyo (JP); Hiroyuki Iwaki, Kanagawa (JP); Matatoshi Honjo, Tokyo (JP)

(73) Assignee: SONY CORPORATION, Tokyo (JP)

( * ) Notice: Subject to any disclaimer, the term of this patent is extended or adjusted under 35 U.S.C. 154(b) by 134 days.

(21) Appl. No.: 15/505,674

(22) PCT Filed: Jul. 9, 2015

(86) PCT No.: PCT/JP2015/069716
§ 371 (c)(1),
(2) Date: Feb. 22, 2017

(87) PCT Pub. No.: WO2016/035451
PCT Pub. Date: Mar. 10, 2016

(65) Prior Publication Data
US 2017/0255502 A1 Sep. 7, 2017

(30) Foreign Application Priority Data
Sep. 3, 2014 (JP) ................... 2014-179109

(51) Int. Cl.
*G06F 11/00* (2006.01)
*G06F 11/07* (2006.01)
(Continued)

(52) U.S. Cl.
CPC .......... *G06F 11/076* (2013.01); *G06F 11/079* (2013.01); *G06F 11/0727* (2013.01);
(Continued)

(58) Field of Classification Search
CPC .. G06F 11/076; G06F 11/0727; G06F 11/079; G06F 12/16; G11C 29/00; G11C 29/44
See application file for complete search history.

(56) References Cited

U.S. PATENT DOCUMENTS

| | | | | |
|---|---|---|---|---|
| 2011/0066900 A1* | 3/2011 | Tokiwa | ............. | G11C 13/0007 714/704 |
| 2012/0033480 A1* | 2/2012 | Hosono | ............. | G11C 13/0004 365/148 |

(Continued)

FOREIGN PATENT DOCUMENTS

| | | |
|---|---|---|
| JP | 2005-056394 A | 3/2005 |
| JP | 2011-060388 A | 3/2011 |

(Continued)

OTHER PUBLICATIONS

Sills, et al., "A Copper ReRAM Cell for Storage Class Memory Applications", VLSI Technology Digest of Technical Papers, 2014, 2 pages.

(Continued)

*Primary Examiner* — Michael Maskulinski
(74) *Attorney, Agent, or Firm* — Chip Law Group

(57) ABSTRACT

Detecting a defective cell in a memory in consideration of an error property difference depending on the storage state. A determination unit determines whether there is a possibility of defect for each of unit-of-storages on a memory cell formed with a non-volatile memory. The non-volatile memory undergoes either a reset operation that transitions a state from a low resistive state (LRS) to a high resistive state (HRS) or a set operation that transitions the state from the (Continued)

high resistive state to the low resistive state. The determination unit determines a unit-of-storage in which the number of errors in predetermined one of the reset operation and the set operation has exceeded a predetermined standard, as a unit-of-storage suspected of having a defect.

19 Claims, 20 Drawing Sheets

(51) Int. Cl.
*G06F 12/16* (2006.01)
*G11C 29/00* (2006.01)
*G11C 29/44* (2006.01)
*G06F 11/10* (2006.01)
*G11C 13/00* (2006.01)
*G11C 11/16* (2006.01)
*G11C 29/04* (2006.01)

(52) U.S. Cl.
CPC .......... *G06F 11/1048* (2013.01); *G06F 12/16* (2013.01); *G11C 29/00* (2013.01); *G11C 29/44* (2013.01); *G11C 11/16* (2013.01); *G11C 13/00* (2013.01); *G11C 2029/0407* (2013.01)

(56) References Cited

U.S. PATENT DOCUMENTS

2017/0329724 A1* 11/2017 Terada .................... G06F 12/16
2018/0226125 A1* 8/2018 Terada .................... G11C 13/00
2018/0366187 A1* 12/2018 Chien ................... G11C 13/004

FOREIGN PATENT DOCUMENTS

| JP | 2011-187144 A | 9/2011 |
| JP | 2012-038387 A | 2/2012 |
| JP | 2014-235773 A | 12/2014 |

OTHER PUBLICATIONS

Tanakamaru, et al., "Hybrid Storage of ReRAM/TLC NAND Flash with RAID-5/6 for Cloud Data Centers", IEEE International Solid-State Circuits Conference, 2014, 467-468 pages.

* cited by examiner

| PHYSICAL PAGE ADDRESS | STATUS OF USE |
|---|---|
| 0 | AVAILABLE |
| 1 | IN USE |
| 2 | IN USE |
| 3 | UNAVAILABLE |
| 4 | OCCURRENCE OF WRITING ERROR |
| 5 | OCCURRENCE OF DEFECTIVE PAGE |
| ⋮ | ⋮ |

| LOGICAL PAGE ADDRESS | ASSIGNMENT STATUS | PHYSICAL PAGE ADDRESS |
|---|---|---|
| 0x0000-0000 | ALREADY ASSIGNED | 323234 |
| 0x0000-0001 | ALREADY ASSIGNED | 323235 |
| 0x0000-0002 | NOT YET ASSIGNED | — |
| 0x0000-0003 | ALREADY ASSIGNED | 88903 |
| ⋮ | ⋮ | ⋮ |

STORAGE CONTROL APPARATUS, STORAGE APPARATUS, AND STORAGE CONTROL METHOD

CROSS REFERENCE TO RELATED APPLICATIONS

This application is a U.S. National Phase of International Patent Application No. PCT/JP2015/069716 filed on Jul. 9, 2015, which claims priority benefit of Japanese Patent Application No. JP 2014-179109 filed in the Japan Patent Office on Sep. 3, 2014. Each of the above-referenced applications is hereby incorporated herein by reference in its entirety.

TECHNICAL FIELD

The present technology relates to a storage apparatus. It particularly relates to a storage control apparatus that manages a defective page on the storage apparatus, a storage apparatus, a processing method therefor, and a program for causing a computer to execute the method.

BACKGROUND ART

In an information processing system, a dynamic random access memory (DRAM), or the like, is used as a working memory. The DRAM is usually a volatile memory in which stored content is lost when the power supply is stopped. Meanwhile, a non-volatile memory (NVM) has gained popularity in recent years. The non-volatile memory is roughly classified into a flash memory and a non-volatile random access memory (NVRAM). The flash memory handles data access that has a large unit in size. The NVRAM is capable of high-speed random access in a small unit. The flash memory is represented by a NAND flash memory. In contrast, exemplary non-volatile random access memories include a resistance RAM (ReRAM), a phase-change RAM (PCRAM), and a magnetoresistive RAM (MRAM).

Conventionally, when a page including a defect associated with memory access (defective page) is determined on such a non-volatile memory, the errors that occur in a write operation or an erase operation are counted. For example, there is proposed a storage apparatus that sends a notification of the number of errors generated by the write operation or the erase operation from a storage apparatus to a memory controller and that performs defect judgment on the memory controller (for example, refer to Patent Document 1).

Meanwhile, it is known that, in a certain type of non-volatile memory, distribution of errors caused by wear of a cell that undergoes repeated rewriting exhibits characteristics that vary depending on the storage state after the writing. For example, there is a known ReRAM in which an error caused by a reset operation that transitions the state from a low resistive state (LRS) to a high resistive state (HRS) is dominant (For example, refer to Non-Patent Document 1). Moreover, there is a known ReRAM in which an error caused by a set operation that transitions the state from the high resistive state (HRS) to the low resistive state (LRS) is dominant (for example, refer to Non-Patent Document 2).

CITATION LIST

Patent Document

Patent Document 1: Japanese Patent Application Laid-Open No. 2005-056394 A

Non-Patent Document

Non-Patent Document 1: Scott Sills et al.: "A Copper ReRAM Cell for Storage Class Memory Applications", 2014 Symposium on VLSI Technology Digest of Technical Papers, pp. 64-65, IEEE (2014)
Non-Patent Document 2: Shuhei Tanakamaru et al.: "Hybrid Storage of ReRAM/TLC NAND Flash with RAID-5/6 for Cloud Data Centers", 2014 IEEE International Solid-State Circuits Conference, IEEE (2014)

SUMMARY OF THE INVENTION

Problems to be Solved by the Invention

In the above-described known art, error bits are count without consideration of an error property difference between the LRS and the HRS. Accordingly, this might lead to a problem of not being able to detect a defective page or detecting a page that is not defective as a defect, depending on the device.

The present technology has been made in view of these circumstances and is intended to detect a defective cell in a memory in consideration of an error property difference depending on the storage state.

Solutions to Problems

The present technology has been made to solve the above-described problem, and a first aspect is a storage control apparatus including a determination unit configured to determine a unit-of-storage in which the number of errors in predetermined one of a reset operation and a set operation of a non-volatile memory toward a memory cell has exceeded a predetermined standard, as a unit-of-storage suspected of having a defect, and a storage control method therefor. This would lead to an action of determining a unit-of-storage suspected of having a defect in consideration of the error property difference depending on the storage state.

Moreover, it is allowable in this first aspect to configure such that the above-described determination unit determines a unit-of-storage in which a total value of the number of errors in the above-described reset operation and the number of errors in the above-described set operation has exceeded a predetermined standard and the number of errors in the above-described predetermined one of the operations has exceeded a predetermined standard, as a unit-of-storage suspected of having a defect. This would lead to an action of determining a unit-of-storage suspected of having a defect from among the unit-of-storages that has produced a writing error.

Moreover, it is allowable in this first aspect to configure such that the above-described determination unit determines a unit-of-storage in which a total value of the number of errors in the above-described reset operation and the number of errors in the above-described set operation has exceeded a predetermined standard by a predetermined number of times and the number of errors on the above-described predetermined one of the operations in the last time of the above-described predetermined number of times has exceeded a predetermined standard, as a unit-of-storage suspected of having a defect. This would lead to an action of determining a unit-of-storage suspected of having a defect using a result that is temporarily closest.

Moreover, it is allowable in this first aspect to configure such that the above-described determination unit determines that a writing error has occurred in a unit-of-storage in a case where the total value of the number of errors in the above-described reset operation and the number of errors in the above-described set operation has exceeded a predetermined standard and the number of errors in the above-described predetermined one of the operations has not exceeded a predetermined standard. This would lead to an action of determining a unit-of-storage not yet having a detect as an ordinary writing error.

Moreover, in this first aspect, it is allowable to configure such that the above-described determination unit determines the above-described unit-of-storage suspected of having a defect, as an unavailable unit-of-storage. Moreover, it is also allowable to further include a management unit configured to reconfirm the above-described unit-of-storage that has been determined as a unit-of-storage suspected of having a defect and to manage the unit-of-storage, in accordance with the result, as an unavailable unit-of-storage. This would lead to an action of managing whether it is available or unavailable for the unit-of-storage suspected of having a defect.

In this case, it is allowable to configure such that, when the number of above-described unit-of-storage determined as a unit-of-storage suspected of having a defect has exceeded a fixed number, the above-described management unit performs the above-described reconfirmation toward the corresponding unit-of-storage. This would lead to an action of performing reconfirmation collectively for a fixed number of unit-of-storages.

Moreover, when the above-described management unit performs the above-described reconfirmation, it is allowable to configure such that the above-described determination unit determines a unit-of-storage in which the number of errors in the above-described predetermined one of the operations has exceeded a standard higher than the above-described predetermined standard, as the above-described unit-of-storage suspected of having a defect. This would lead to an action of producing difficulty in handling as a defect in reconfirmation.

Moreover, in this first aspect, it is allowable to configure such that the above-described determination unit selects the above-described predetermined standard for the number of errors in the above-described predetermined one of the operations, from among a plurality of candidates. This would lead to an action of determining a defect by the standard corresponding to a condition.

In this case, it is allowable to configure such that the above-described determination unit selects the above-described predetermined standard from among the above-described plurality of candidates in accordance with a state over time in which the above-described non-volatile memory is used. This would lead to an action of determining a defect using a standard according to the state over time.

Moreover, it is also allowable to configure such that the above-described determination unit selects the above-described predetermined standard from among the above-described plurality of candidates in accordance with a predetermined identifier of the above-described non-volatile memory. This would lead to an action of determining a defect by the standard corresponding to the predetermined identifier such as a manufacturing lot number.

Moreover, it is allowable, in this first aspect, to configure such that the above-described determination unit determines a unit-of-storage in which each of the number of errors in the above-described reset operation and the number of errors in the above-described set operation has exceeded a predetermined standard and the number of errors in the above-described predetermined one of the operations has exceeded a predetermined standard, as a unit-of-storage suspected of having a defect. This would lead to an action of evaluating the number of errors in the reset operation and the set operation, independently from each other.

Moreover, it is allowable to configure, in this first aspect, such that the above-described determination unit determines a unit-of-storage in which a weighted sum of the number of errors in the above-described reset operation and the number of errors in the above-described set operation has exceeded a predetermined standard, and the number of errors in the above-described predetermined one of the operations has exceeded a predetermined standard, as a unit-of-storage suspected of having a defect. This would lead to an action of performing evaluation by a balance corresponding to a device characteristic of the memory.

Moreover, in this first aspect, it is also allowable to configure such that, when the number of errors in the predetermined one of the operations is in a fixed state that does not exceed the above-described predetermined standard, the above-described determination unit determines the above-described unit-of-storage as a unit-of-storage having a possibility of transitioning to a unit-of-storage suspected of having a defect. This would lead to an action of sending a notification that it is a state just before becoming a defect.

Moreover, in this first aspect, it is also allowable to configure such that, when the above-described determination unit processes an erase request of erasing all bits of a unit-of-storage, the above-described determination unit determines the unit-of-storage as the unit-of-storage suspected of having a defect in a case where the number of errors in the above-described predetermined one of the operations has exceeded a standard lower than the above-described predetermined standard. This would lead to an action of making it easier to make determination of a defect for the erase request of erasing all bits of the unit-of-storage.

Moreover, a second aspect of the present technology is a storage apparatus that includes a memory cell formed of a non-volatile memory, and a determination unit configured to determine a unit-of-storage in which the number of errors in predetermined one of the reset operation and the set operation toward the above-described memory cell has exceeded a predetermined standard, as a unit-of-storage suspected of having a defect. This would lead to an action of determining a unit-of-storage suspected of having a defect in consideration of the error property difference depending on the storage state of the memory cell on the storage apparatus.

Moreover, in the second aspect, it is also allowable to further provide a counter for counting each of the number of errors in the above-described reset operation and the number of errors in the above-described set operation. This would lead to an action of counting the number of errors on the storage apparatus and using the result for defect determination.

Effects of the Invention

With the present technology, it is possible to have an effect of achieving detection of a defective cell in a memory in consideration of the error property difference depending on the storage state. Note that effects described herein are non-limiting. The effects may be any effects described in the present disclosure.

BRIEF DESCRIPTION OF DRAWINGS

FIG. 5 is a diagram illustrating an exemplary configuration of a blank page table 261 according to an embodiment of the present technology.

FIG. 6 is a diagram illustrating an exemplary configuration of an address conversion table 262 according to an embodiment of the present technology.

MODE FOR CARRYING OUT THE INVENTION

Hereinafter, embodiments of the present technology (hereinafter, embodiment(s)) will be described. Description will be presented in the following order.

1. First Embodiment (exemplary determination of occurrence of defective page, on memory)
2. Second Embodiment (exemplary determination of occurrence of defective page, on storage control apparatus)
3. Modification Example 1. First Embodiment

[Configuration of Information Processing System]

Figure 1:
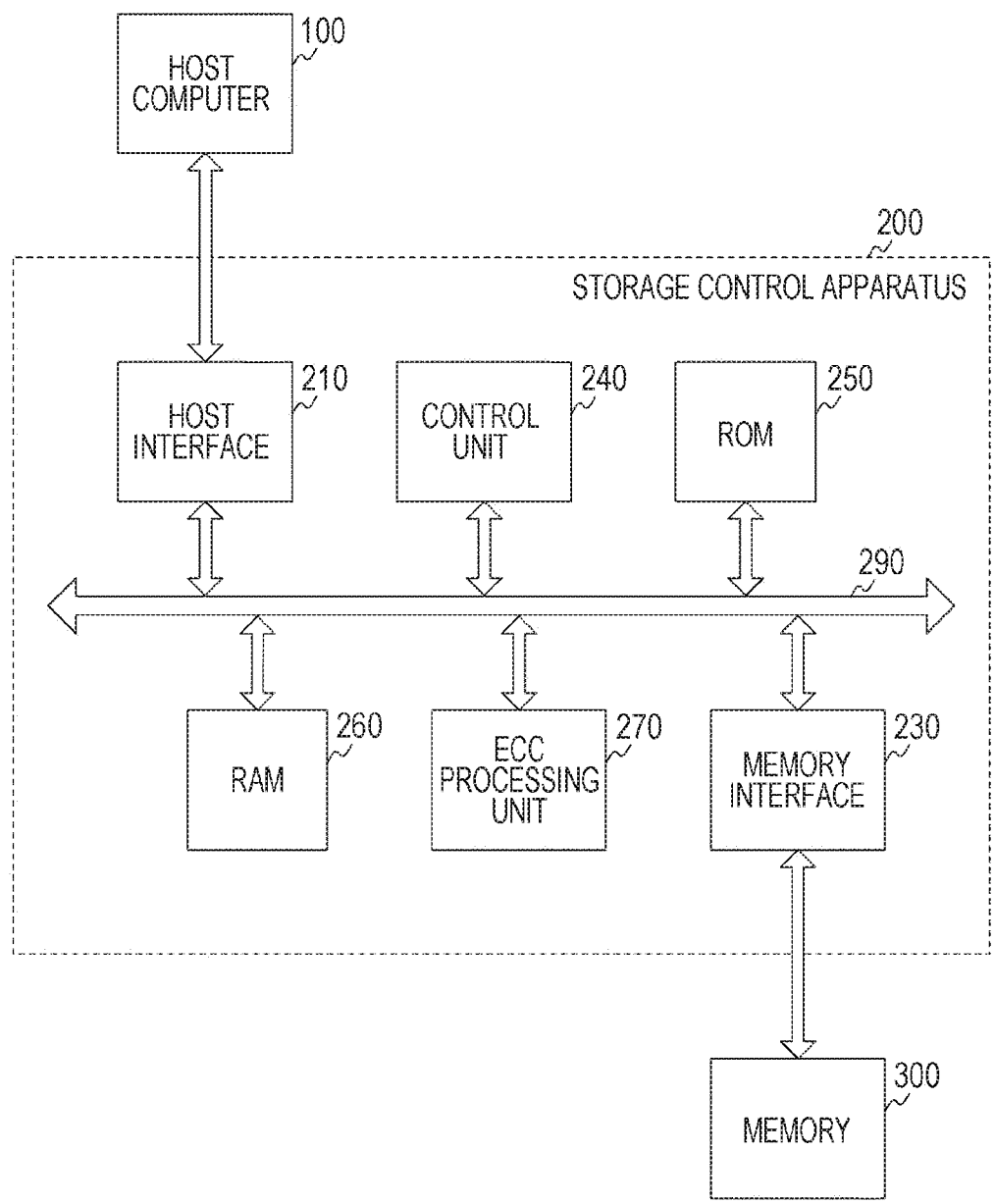
FIG. 1 is a diagram illustrating an exemplary configuration of an information processing system according to an embodiment of the present technology.

FIG. 1 is a diagram illustrating an exemplary configuration of an information processing system according to an embodiment of the present technology. The information processing system includes a host computer 100, a storage control apparatus 200, and a memory 300. The host computer 100 is an apparatus that executes individual processing on the information processing system. The memory 300 is a memory that stores data needed for processing on the host computer 100. The memory 300 assumes a non-volatile memory. The memory 300 attempts to enhance data retention characteristic by storing an error correcting code (ECC) together with data. The storage control apparatus 200 is an apparatus that is connected between the host computer 100 and the memory 300 and that controls the memory 300 in response to a request from the host computer 100. Note that the error correcting code includes a function of error (fault) detection and thus also referred to as a fault detection sign, an error detection sign, an error detection code, or the like.

The storage control apparatus 200 includes a host interface 210, a memory interface 230, a control unit 240, a ROM 250, a RAM 260, and an ECC processing unit 270. These are interconnected via a bus 290.

The host interface 210 is an interface circuit that performs communication with the host computer 100. The memory interface 230 is an interface circuit that performs communication with the memory 300.

The control unit 240 is a processing apparatus that executes various types of processing on the storage control apparatus 200. The ROM 250 is a read-only memory that stores a program executed on the control unit 240 and parameters needed for execution of the program. The RAM 260 is a memory that stores working region needed for processing on the control unit 240.

The ECC processing unit 270 performs processing related to the error correcting code stored in the memory 300. As described below, the ECC processing unit 270 includes a function of generating the error correcting code and a function of performing error correction on the basis of the data and the error correcting code read from the memory 300.

An access space of the memory 300 is managed by being partitioned into physical pages with fixed lengths. Each of the physical pages of the memory 300 is mapped to a logical page. Access from the host computer 100 is typically performed from the logical address. Hereinafter, it is assumed that the data size of the logical page is 256 bytes and the physical page stores 256 bytes of data and 16 bytes of the error correcting code. Note that each of these sizes is merely an example and the present technology is not limited to these.

Figure 2:
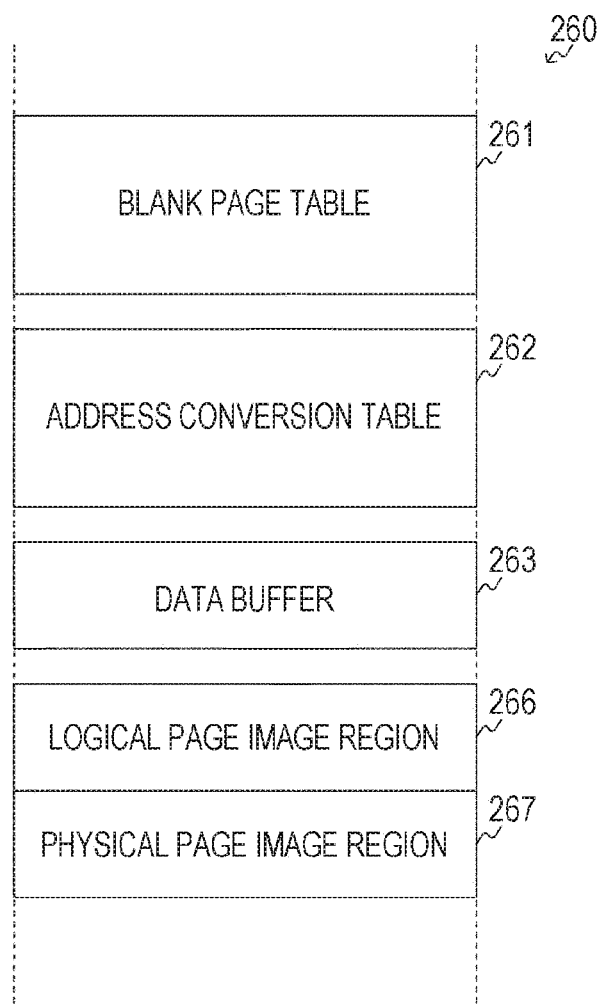
FIG. 2 is a diagram illustrating an exemplary outline of a memory map of a RAM 260 according to an embodiment of the present technology.

FIG. 2 is a diagram illustrating an exemplary outline of a memory map of the RAM 260 according to an embodiment of the present technology. Herein, the RAM 260 stores a blank page table 261, an address conversion table 262, a data buffer 263, a logical page image region 266, and a physical page image region 267. Note that the program executed on the control unit 240 and the region, or the like, used in the execution are also secured inside the RAM 260.

The blank page table 261 is a table that manages a status of use of the physical page inside the memory 300. As described below, the blank page table 261 retains the status of use of the physical page corresponding to the physical page address.

The address conversion table 262 is a table for converting the logical address provided from the host computer 100 into the physical page address of the memory 300. As described below, the address conversion table 262 retains a physical page address corresponding to each of the logical page addresses.

The data buffer 263 is a buffer for retaining write data from the host computer 100 toward the memory 300. The present embodiment assumes that at least the data equivalent of the maximum size of the write data constituting a write command instructed by the host computer 100 is retained.

The logical page image region 266 is a region for retaining an image of the logical page grasped from the host computer 100. The physical page image region 267 is a region for retaining an image of the physical page on the memory 300 side. In the present embodiment, the logical page image region 266 is a region of 256 bytes, equal to the size of the logical page, and the physical page image region 267 is a region of 272 bytes that is equal to the size of the physical page.

The two types of tables, namely, the blank page table 261 and the address conversion table 262 are stored at a predetermined position of the memory 300 while the power supply is interrupted. In initialization processing at the time of power-on, the storage control apparatus 200 reads these two types of tables from a predetermined position and temporarily accumulates these tables in the RAM 260. Upon receiving a power-off notice from the host computer 100, the storage control apparatus 200 writes these two types of tables into a predetermined position of the memory 300. Moreover, in order to suppress an effect of unexpected power-off to the minimum, processing of writing these two types of tables into the memory 300 is performed at a certain point, for example, after a fixed time elapses or when a fixed number of times of processing is performed.

Figure 3:
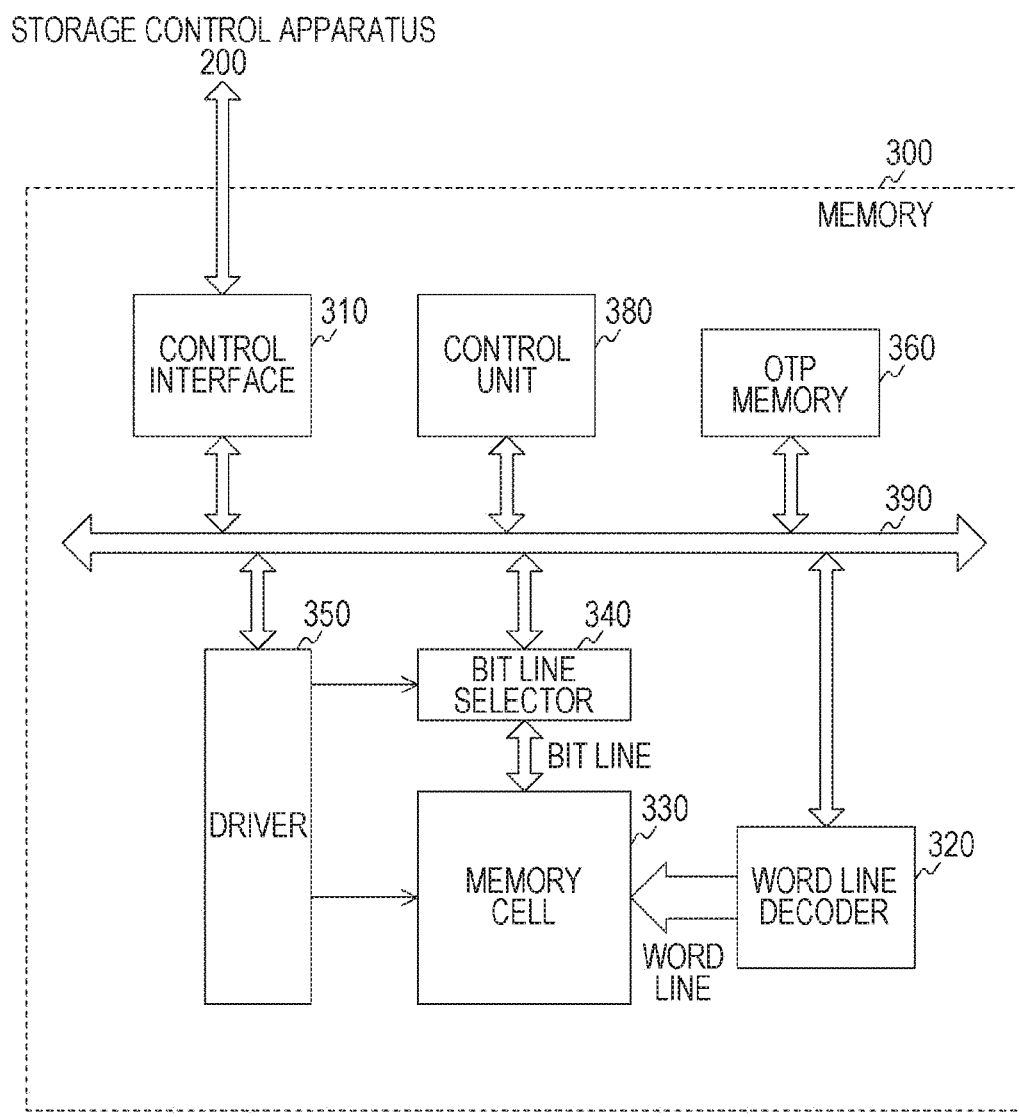
FIG. 3 is a diagram illustrating an exemplary configuration of a memory 300 according to an embodiment of the present technology.

FIG. 3 is a diagram illustrating an exemplary configuration of the memory 300 according to an embodiment of the present technology. The memory 300 includes a control interface 310, a word line decoder 320, a memory cell 330, a bit line selector 340, a driver 350, an OTP memory 360, and a control unit 380. These are interconnected via a bus 390.

The control interface 310 is an interface circuit that performs communication with the storage control apparatus 200. The control interface 310 inputs information and data transferred from the storage control apparatus 200 and outputs information and data to be transferred to the storage control apparatus 200.

The memory cell 330 is a storage element, herein, assuming a non-volatile memory. The memory cell 330 has a structure in which a single memory cell that records 1-bit data is arranged two-dimensionally. For example, the configuration includes 272 bytes of single memory cells for the physical page arranged in the horizontal direction, further being arranged along the physical page address in the vertical direction.

The word line decoder 320 decodes a physical page address input from the control interface 310, thereby driving one word line that corresponds to the physical page. Between the word line decoder 320 and the memory cell 330, one word line is arranged for each of all the physical pages. That is, the physical page address and the word line correspond to each other, on one-to-one basis. The physical page that corresponds to the word line driven on the memory cell 330 is activated.

The bit line selector 340 is a buffer having the size equal to the size of the physical page of the memory cell 330. The bit line selector 340 performs data communication with the physical page activated on the memory cell 330.

The driver 350 is a driver that supplies bit line voltage to the bit line selector 340 and supplies plate voltage to the bit line selector 340 and the memory cell 330. That is, the driver 350 supplies drive voltage across the plate and the bit line.

The one time programming (OTP) memory 360 is a memory that stores a start-up program (boot strap program) for the control unit 380 and parameters needed for operation of the control unit 380. The OTP memory 360 is implemented with an anti-fuse, or the like, and recording is performed, for example, at a manufacturing factory when the memory 300 is shipped. In the present embodiment, two types of thresholds (TH_PASS and TH_BAD_PAGE) described below are recorded and these thresholds are read from the OTP memory 360 at the time of start-up of the memory 300.

The control unit 380 controls the entire memory 300. In a case where an instruction from the storage control apparatus 200 is write, the control unit 380 supplies the physical page address transferred to the control interface 310, to the word line decoder 320, and activates a designated physical page on the memory cell 330. The control unit 380 further creates mask data used at a set operation and a reset operation, from the data read from the designated physical page and the write data. The control unit 380 supplies the mask data to the bit line selector 340 and applies voltage bias for the set operation and the reset operation, to the activated physical page by operating the driver 350 and the bit line selector 340. This leads to execution of writing toward the activated physical page.

In a case where the instruction from the storage control apparatus 200 is read, the control unit 380 inputs the physical page address transferred to the control interface 310, into the word line decoder 320 so as to activate the designated physical page on the memory cell 330. The control unit 380 further applies voltage bias in the read operation to the activated physical page by operating the driver 350 and the bit line selector 340. With this operation, the activated physical page is read and supplied to the bit line selector 340. The control unit 380 supplies the data read by the bit line selector 340 to the control interface 310 and transfers the data to the storage control apparatus 200 via the control interface 310.

Note that, hereinafter, the logical address designated from the host computer 100 and the logical page address treated inside the storage control apparatus 200 will be described in hexadecimal starting with "0x", and the physical page address will be described in decimal.

Figure 4A:
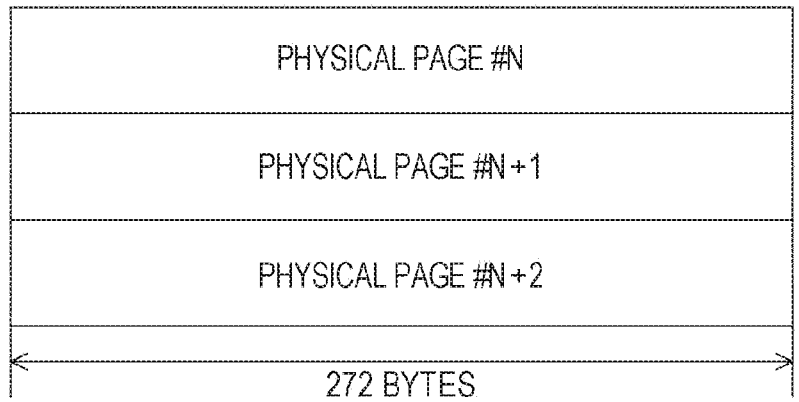
FIGS. 4(a) and 4(b) are diagrams illustrating an exemplary page structure on the memory 300 according to an embodiment of the present technology.
Figure 4B:
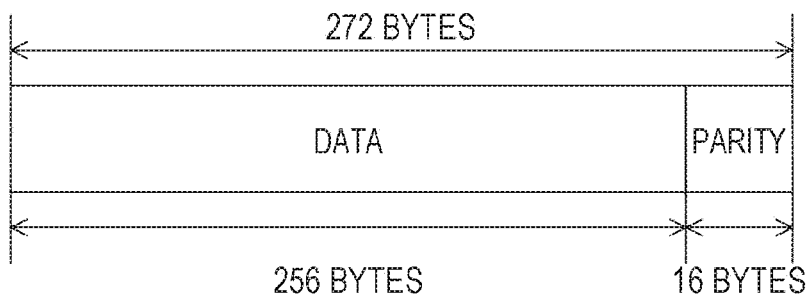

FIGS. 4(*a*) and 4(*b*) are diagrams illustrating an exemplary page structure on the memory 300 according to an embodiment of the present technology. As illustrated in FIG. 4(*a*), the present embodiment assumes the size of the physical page stored in the memory cell 330 to be 272 bytes. In addition, in a case where 256 bytes of data and 16 bytes of an error correcting code (parity) are stored in this physical page, 272 bytes of physical pages are used for the 256 bytes of data and the 16 bytes of parity, as illustrated in FIG. 4(*b*).

[Table Configuration]

FIG. 5 is a diagram illustrating an exemplary configuration of the blank page table 261 according to an embodiment of the present technology. The blank page table 261 retains the status of use of the physical page corresponding to the individual physical page address. Each of the entries (rows) of the blank page table 261 is configured with two elements, namely, 'physical page address' and 'status of use'.

On the blank page table 261, the status of the physical page indicated on the 'physical page address' in each of the entries is indicated in 'status of use'. Herein, 'status of use' mainly represents a state of use, specifically, whether the physical page in the memory cell 330 is not used (available), or it is used (in use). Moreover, 'status of use' indicates a state related to an error, for example, that a writing error has occurred (occurrence of writing error), that a defective page error has occurred (occurrence of defective page), and that defective page verification is made and future use is not recommended (unavailable). The page determined as the occurrence of a defective page needs observation and whether the page becomes available or unavailable needs judgment afterward. Specifically, since the writing error occurs with a certain probability, there is a possibility that writing is executable with no problem on a page in the state of 'occurrence of writing error' in succeeding or later times of writing. Since the defective page error occurs on a page that has a possibility of degradation due to cell wear as a result of repeated rewriting, the page that is in a state of 'occurrence of defective page' needs careful handling.

The blank page table 261 arranges each of the entries in ascending order of numerical values of 'physical page address'. The number of entries registered on the blank page table 261 is equal to the number of physical pages provided in the memory cell 330 inside the memory 300.

Note that the numerical value of the 'physical page address' on the blank page table 261 starts from zero and increases by one, and the value can be easily calculated from the entry number. Therefore, it is possible to delete 'physical page address' from entry items and to allow 'status of use' alone to be set as the components of the entry.

FIG. 6 is a diagram illustrating an exemplary configuration of the address conversion table 262 according to an embodiment of the present technology. The address conversion table 262 retains a physical page address corresponding to each of the logical page addresses. That is, the address conversion table 262 indicates a correspondence between the logical address used with the host computer 100, and the physical page address used on the storage control apparatus 200 and the memory 300.

Inside the storage control apparatus 200 according to the present embodiment, the logical address designated from the host computer 100 is managed by a unit of logical page address. Herein the logical page and the physical page has a one-to-one relationship, meaning one physical page is allocated to one logical page. The size of the logical page is 256 bytes, which is equal to the 256 bytes that is a sum of data within the physical page. The quotient obtained by dividing the logical address designated from the host computer 100 by the logical page size is to be the logical page address. Note that, since the position indicated by a write address or a read address configuring a write command or a read command, respectively, issued by the host computer 100, is limited to a head of the logical page in the present embodiment, an offset address is always zero.

Each of the entries of the address conversion table 262 is configured with three elements, namely, 'logical page address', 'assignment status', and 'physical page address'. On the logical page indicated by 'logical page address' in each of the entries, whether the physical page is assigned ("already assigned") or not ("not yet assigned") is indicated at 'assignment status'. In addition, as for the logical page in which 'assignment status' is "already assigned", an address of the corresponding physical page is indicated at 'physical page address'.

In an example in the same diagram, since 'assignment status' indicates "not yet assigned" in the entry in which 'logical page address' is "0x0000-0002", the value of 'physical page address' has no meaning. Accordingly, the value of 'physical page address' for this entry indicates "-".

The address conversion table 262 arranges each of the entries in ascending order of numerical values of 'logical page address'. The number of entries registered on the address conversion table 262 is equal to the quotient obtained by dividing the size (unit: byte) of the logical address space disclosed by the storage control apparatus 200 toward the host computer 100, by the logical page size of 256 bytes.

The number of entries registered on the address conversion table 262 is smaller than the number of physical pages provided in the memory cell 330 within the memory 300. This is because the number of physical pages is provided with sufficient allowance with respect to the number of logical pages due to the reason that, for example, the physical page might be unavailable for the reason such as an error, as described for the blank page table 261.

Note that the numerical value of the 'logical page address' on the address conversion table 262 starts from zero and increases by one, and thus the numerical value can be easily calculated from the entry number. Therefore, it is also possible to delete 'logical page address' from entry items and allow 'assignment status' and 'physical page address' to be set as the components of the entry.

[Internal Configuration of Memory]

Figure 7:
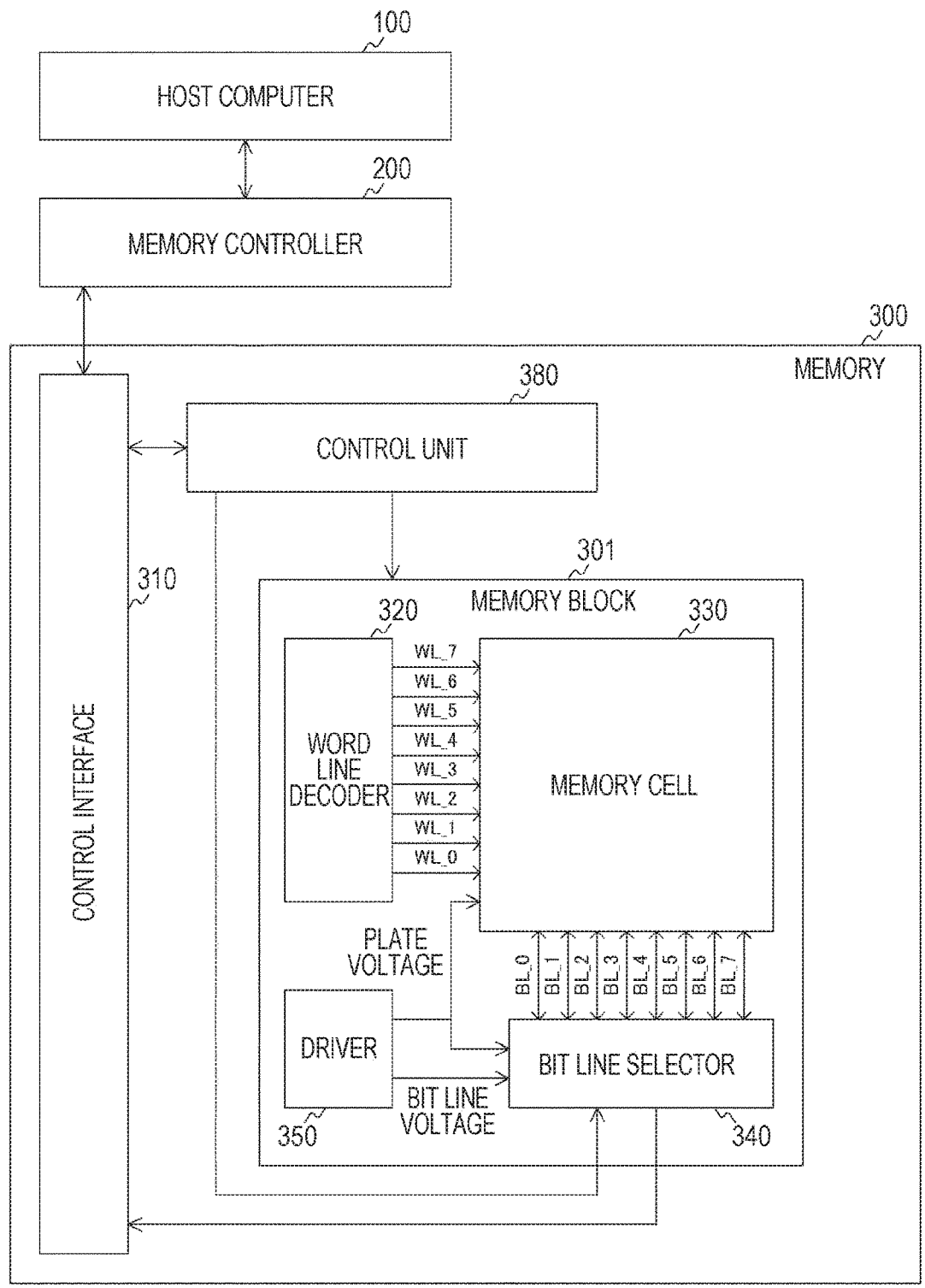
FIG. 7 is a diagram illustrating an exemplary internal configuration of the memory 300 according to an embodiment of the present technology.

FIG. 7 is a diagram illustrating an exemplary internal configuration of the memory 300 according to an embodiment of the present technology. Herein, a memory block 301 includes the word line decoder 320, the memory cell 330, the bit line selector 340, and the driver 350.

The memory cell 330 includes an access transistor and a variable resistance element at each of intersections of a plurality of word lines (WL) and a plurality of bit lines (BL). The memory cell 330 includes word lines of the number equal to the number of physical page addresses, bit lines of the number equal to the number of bit lines of the physical page size, and a plate terminal. The word line is connected to the word line decoder 320. The bit line is connected to the bit line selector 340. The plate terminal is connected to plate voltage output of the driver 350.

The variable resistance element in the memory cell 330 records 1-bit information in two states of a high resistive state (HRS) and a low resistive state (LRS). Association between each of the states and the logical value is optional. However, hereinafter, is defined such that the low resistive state is used to represent a logical value '1', and the high resistive state is used to define a logical value '0'. Moreover, the operation to perform transition between the two states is referred to as a bit inversion operation. The bit inversion operation includes two operations, namely, the set operation and the reset operation. Hereinafter, the set operation is performed to transition a bit from the high resistive state to the low resistive state, and the reset operation is performed to transition a bit from the low resistive state to the high resistive state. In other words, the set operation transitions the bit from the logical value '0' to the logical value '1', and the reset operation transitions the bit from the logical value '1' to the logical value '0'. In write processing, the set operation and the reset operation is performed sequentially, although the order may be any order, that is, which may come first.

The word line decoder 320 receives word line designation from the control unit 380 and controls a word line of the memory cell 330. Specifically, the word line decoder 320 has a function of driving the word line designated by the control unit 380 with the logical value 'H' and driving the other word lines with the logical value 'L'. In a case where the word line designation is not performed, or the word line designation has been canceled, the word line decoder 320 drives all the word lines with the logical value 'L'.

The bit line selector 340 sends/receives the read data read from the memory cell 330 and the write data for writing to/from the control unit 380. Moreover, the bit line selector 340 receives from the driver 350 the voltage to drive the bit line.

The bit line selector 340 has roughly two functions. First, the bit line selector 340 functions as a sense amplifier at the time of reading from the memory cell 330. Specifically, the bit line selector 340 discerns whether the selected variable resistance element is in the low resistive state or the high resistive state by measuring the amperage flowing at the bit line, and decides either the logical value '0' or '1' for each of the bit lines. The decided logical value is output onto the control unit 380.

Second, the bit line selector 340 has a function of selecting the drive voltage for each of the bit lines on the basis of designation by the control unit 380 at the time of writing into the memory cell 330. Specifically, the bit line selector 340 selectively supplies either the plate voltage or the bit line voltage supplied from the driver 350, toward each of the bit lines.

Figure 8:
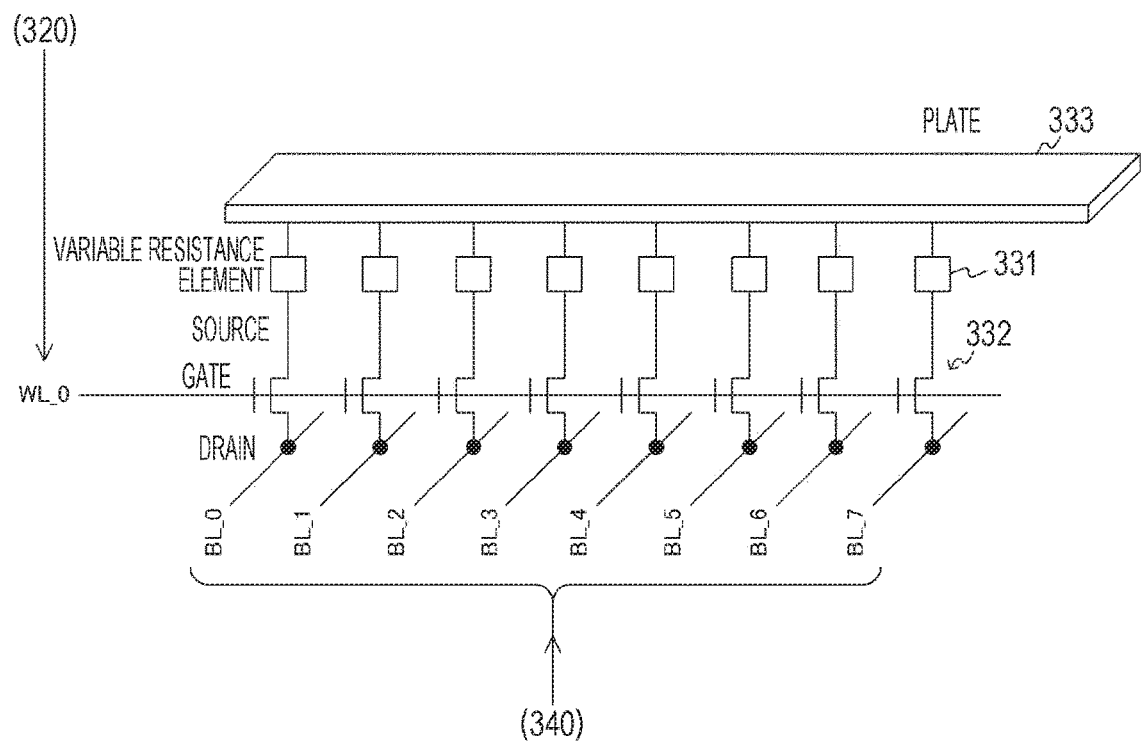
FIG. 8 is a diagram illustrating an exemplary structure of a memory cell 330 according to an embodiment of the present technology.

FIG. 8 is a diagram illustrating an exemplary structure of the memory cell 330 according to an embodiment of the present technology. While this diagram schematically illustrates a cross section taken along a single word line WL_0, other word lines also have the similar structures. Moreover, among the bit lines, eight head lines are selectively illustrated. Each of intersections between the word line WL_0 and eight bit lines (BL_0 to BL_7) is connected with a field effect transistor (FET) 332 as an access transistor and a variable resistance element 331.

The word line WL_0 is connected with eight gate terminals of the FET 332 while eight bit lines (BL_0 to BL_7) are connected to corresponding FET 332 drain terminals. Eight FET source terminals are individually connected to a plate 333 via the variable resistance element 331.

Figure 9:
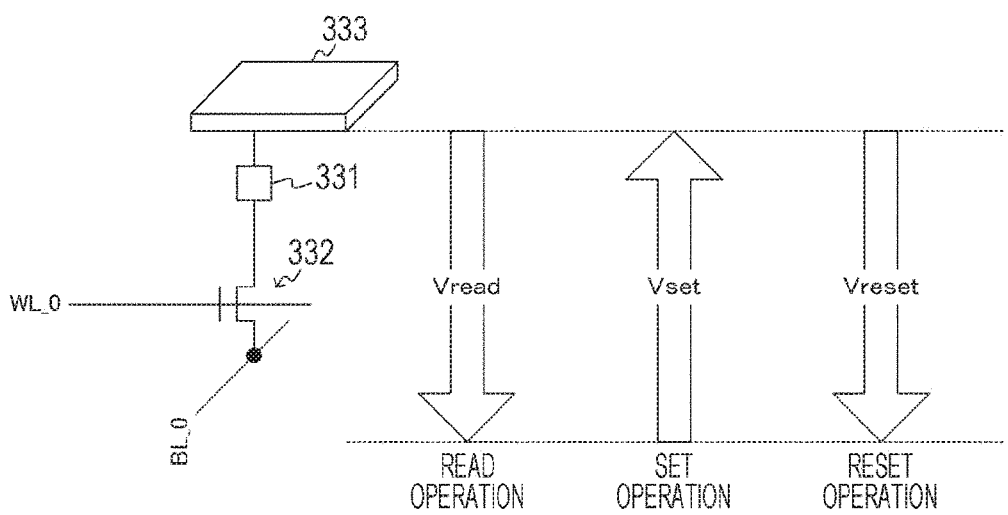
FIG. 9 is a diagram illustrating drive voltage of the memory cell 330 according to an embodiment of the present technology.

FIG. 9 is a diagram illustrating drive voltage of the memory cell 330 according to an embodiment of the present technology. The operation of the memory cell 330 toward the variable resistance element 331 includes a read operation for reading the state of the variable resistance element 331, in addition to the above-described set operation and reset operation. The drive voltage across the plate 333 and the bit line BL_0 varies in each of the three operations, namely, the read operation, the set operation, and the reset operation.

In the case of set operation, the voltage bias is set such that the plate 333 is set to the potential '+Vset' with respect to the bit line. In the case of reset operation, the voltage bias is set such that the bit line is set to the potential '+Vreset' with respect to the plate 333. Moreover, in the case of read operation, the voltage bias is set such that the bit line is set to the voltage '+Vread' with respect to the plate 333.

[Functional Configuration]

Figure 10:
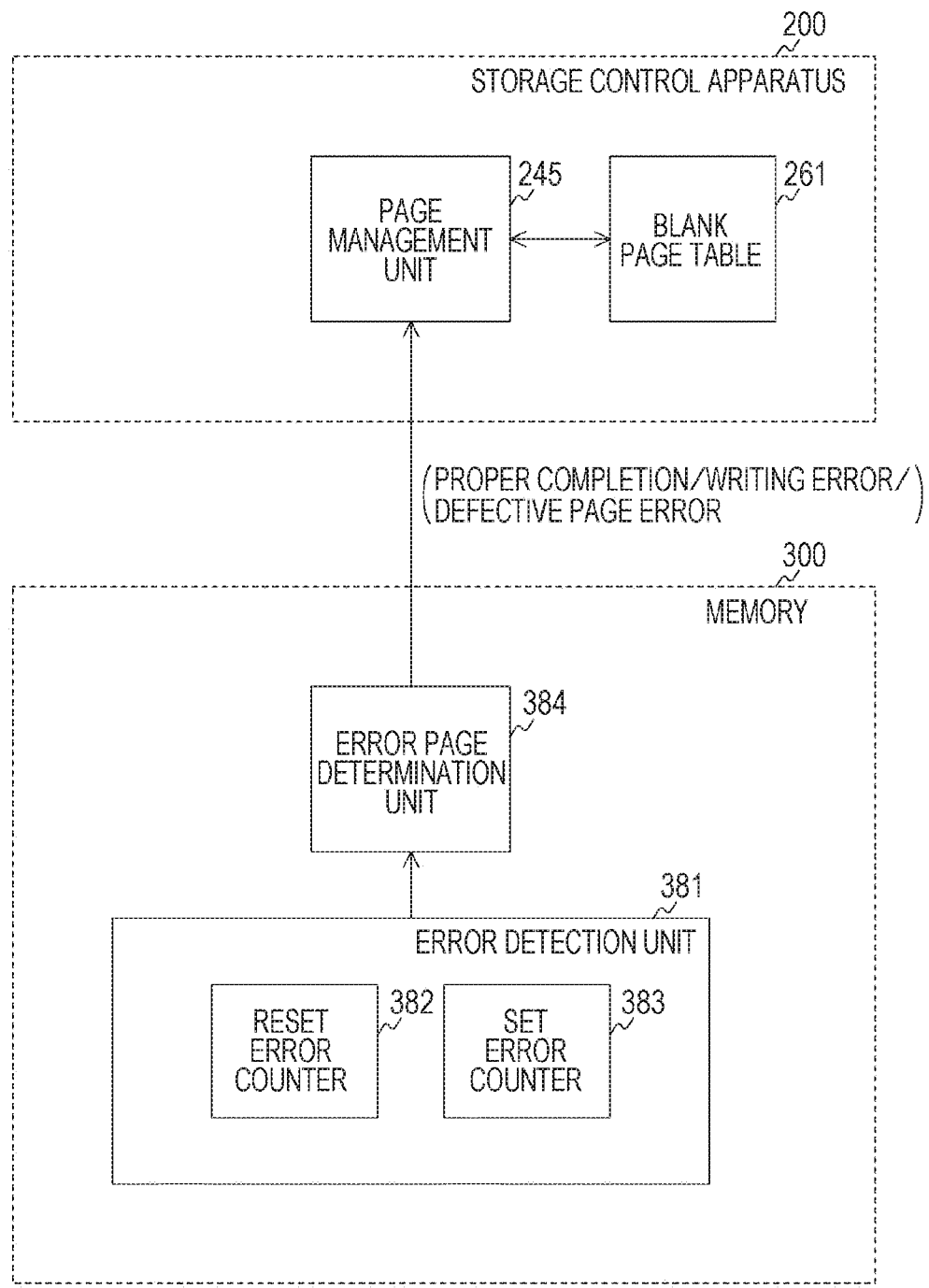
FIG. 10 is a diagram illustrating an exemplary functional configuration of an information processing system according to a first embodiment of the present technology.

FIG. 10 is a diagram illustrating an exemplary functional configuration of an information processing system according to a first embodiment of the present technology. Herein, the memory 300 includes an error detection unit 381 and an error page determination unit 384. Moreover, the storage control apparatus 200 include a page management unit 245.

The error detection unit 381 detects an error that has occurred on a physical page of the memory 300 and counts the number of errors (bit number) that have occurred on the physical page. The error detection unit 381 includes a reset error counter 382 and a set error counter 383. The reset error counter 382 is a counter that counts the number of errors that occurred in the reset operation as the number of reset errors. The set error counter 383 is a counter that counts the number of errors that occurred in the set operation as the number of set errors.

The error page determination unit 384 determines the state of error occurrence by a unit of page on the basis of the number of errors detected on the error detection unit 381. For example, when the total value of the number of reset errors and the number of set errors is below a threshold (TH_PASS), it is determined that no error occurred. In contrast, in a case where the total value of the number of reset errors and the number of set errors is the threshold (TH_PASS) or above, and when the number of reset errors is a threshold (TH_BAD_PAGE) or above, it is determined that a defective page error has occurred. Moreover, in other case where the total value of the number of reset errors and the number of set errors is the threshold (TH_PASS) or above, and when the number of reset errors is below the threshold (TH_BAD_PAGE), it is determined that a simple writing error has occurred. Note that the error page determination unit 384 is an exemplary determination unit described in attached claims.

The page management unit 245 manages the blank page table 261. In a case where a notification of the occurrence of a defective page error is sent from the error page determination unit 384, the page management unit 245 stores 'occurrence of defective page' at the status of use on the blank page table 261 of the corresponding physical page. In contrast, in a case where a notification of the occurrence of a writing error is sent from the error page determination unit 384, 'occurrence of write error' is stored at the status of use on the blank page table 261 of the corresponding physical page. Note that the page management unit 245 is an exemplary management unit described in attached claims.

Moreover, in a case where the number of entries recorded on the blank page table 261 as 'occurrence of defective page' has exceeded a fixed number, for example, the page management unit 245 reconfirms the physical page having an attribute of 'occurrence of defective page'. For example, in a case where writing is performed onto the physical page having the attribute of 'occurrence of defective page' and as a result of this, the notification of the occurrence of the defective page error is sent from the memory 300, 'unavailable' is stored at the status of use of the blank page table 261 of the physical page. In contrast, in another case where the notification of the occurrence of the defective page error has not been sent from the memory 300, 'available' is stored at the status of use of the blank page table 261 of the physical page. In this manner, it is possible to judge whether the page once determined as the page involving the occurrence of defective page can be used thereafter. Note that, while the page in which a defective page error has occurred is determined to be 'unavailable' by reconfirming the physical page having the attribute of 'occurrence of defective page' in the present embodiment, it is allowable to determine the page in which the defective page error has occurred, as 'unavailable', without performing reconfirmation.

[Operation of Information Processing System]

Figure 11:
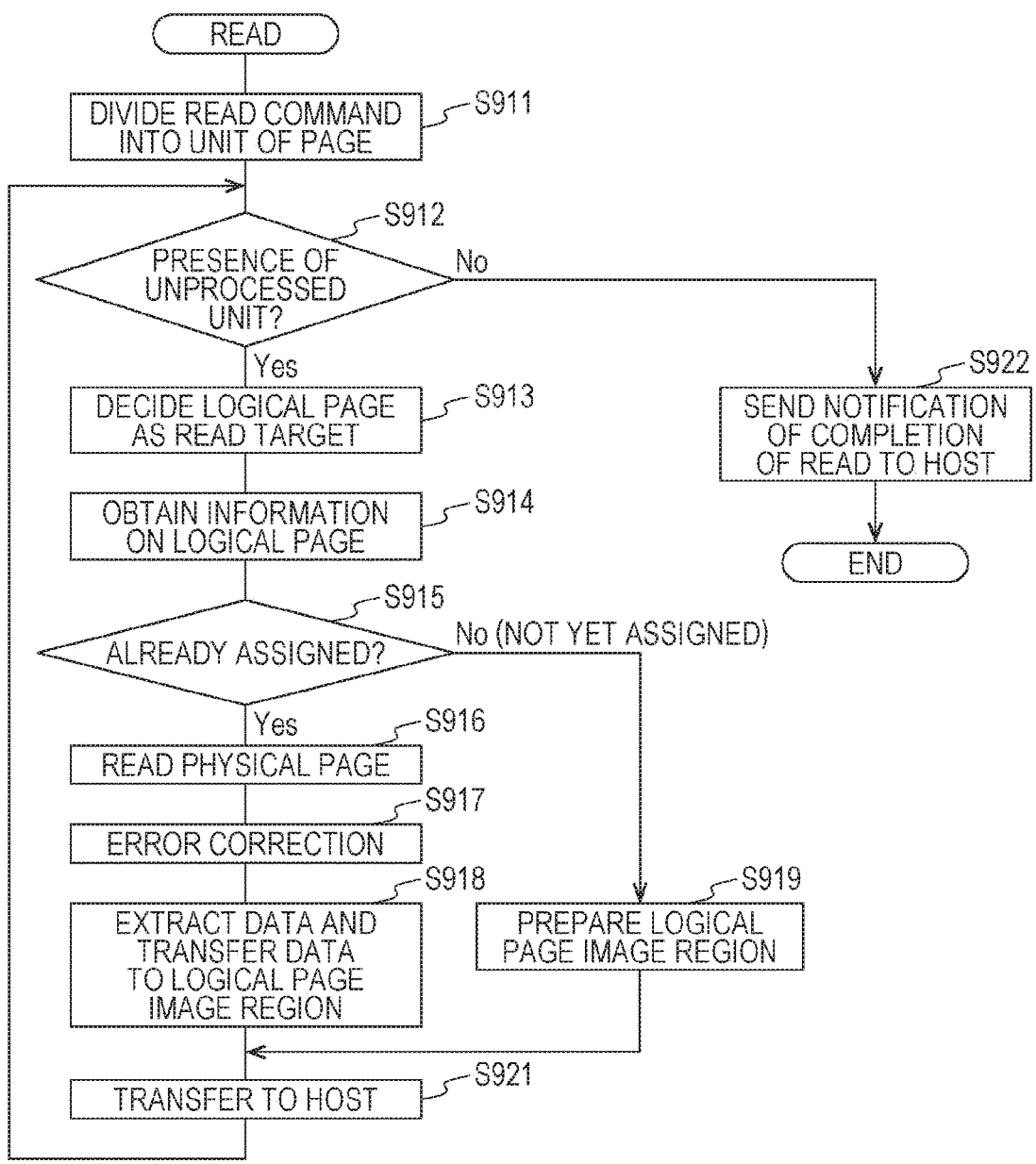
FIG. 11 is a flowchart illustrating an exemplary read operation of a storage control apparatus 200 according to an embodiment of the present technology.

FIG. 11 is a flowchart illustrating an exemplary read operation of the storage control apparatus 200 according to an embodiment of the present technology. First, the read command issued from the host computer 100 is input into the storage control apparatus 200 via the host interface 210. The read command includes 'read address' and 'read data size'. The 'read address' is a logical address of read target data. Herein, the position indicated by the read address is limited to the head of the logical page. Moreover, the read data size is limited to a multiple of the logical page size.

The control unit 240 divides the 'read address' and the 'read data size' constituting the read command, into the unit of logical page (step S911).

Subsequently, it is determined (step S912) whether there is a remaining logical page unit for which read processing is not yet processed among the logical page unit divided in step S911. In a case where there is no remaining read processing of the logical page unit (step S912: No), a notification of the end of read command processing is sent to the host computer 100 and the read operation is finished (step S922).

In contrast, in a case where there is remaining read processing of the logical page unit (step S912: Yes), one of the remaining read processing of the logical page unit is selected (step S913). Herein, it is assumed to select in the order from a younger logical page address. Subsequently, the information on the logical page corresponding to the selected read processing of the logical page unit is obtained from the address conversion table 262 (step S914).

Subsequently, it is confirmed whether a physical page is assigned to the logical page to be processed (step S915). Specifically, in a case where 'assignment status' is "not yet assigned", processing proceeds to step S919, and in a case where it is "already assigned", the processing proceeds to step S916.

In a case where 'assignment status' is "not yet assigned" (step S915: No), this means the physical page for the logical page as a read target is not assigned, and thus, data to be used as a notification to the host computer 100 is prepared (step S919). Specifically, the logical page image region 266 is cleared to zero. It is also allowable to perform initialization using periodic data such as "0x00", "0xFF", or using predetermined specific data, not to zero-clear. Moreover, while the present example performs initialization each time the processing passes through step S919, it is also possible to prepare a special region for initialization at the time of power-on, etc. at the RAM 260 and to send a notification of data of the special region in a case where there is read toward the logical page to which the physical page assignment has not been performed.

Moreover, in response to the read toward the logical page to which the physical page has not been assigned, it is also possible to read a physical page already assigned within the memory 300 and transfer the physical page to the host computer 100. By previously performing write to the previously assigned physical page, it is possible to transfer data different for each of memories, to the host computer 100.

In a case where 'assignment status' is "already assigned" (step S915: Yes), data read toward the corresponding logical page is performed (step S916). The physical page address at this time is 'physical page address' read from the address conversion table 262 in step S914. At this time, the storage control apparatus 200 sends a notification of a read instruction and a physical page address to the memory 300, as a read request. The memory 300 reads the content of the physical page that corresponds to the designated physical page address and transfers it to the storage control apparatus 200. The storage control apparatus 200 stores physical page data transferred from the memory 300, into the physical page image region 267.

Next, the ECC processing unit 270 performs error correction (step S917). At that time, a head address of the physical page image region 267 and an error correction instruction are given to the ECC processing unit 270. The ECC processing unit 270 reads 272 bytes from the head address of the physical page image region 267 and performs error correction processing assuming that 16 bytes of parity has been added to the 256 bytes of user data. Subsequently, the result of this is written back to the same position of the physical page image region 267.

Next, the control unit 240 extracts data from the physical page image region 267 and transfers the data to the logical page image region 266 (step S918). Specifically, 256 bytes are read from the head of the physical page image region 267 and transfers them to the logical page image region 266.

When the logical page image region 266 is prepared with this procedure (step S918 or S919), the data of the logical page image region 266 are transferred to the host computer 100 (step S921). That is, transfer of a portion of 'logical page' is performed from the head position of the logical page image region 266. Thereafter, processing from step S912 is repeated.

Note that while the present embodiment performs data copy in each of data extraction processing (step S918) and transfer processing to the host computer 100 (step S921), it is also allowable to perform transfer directly from the physical page image region 267.

Figure 12:
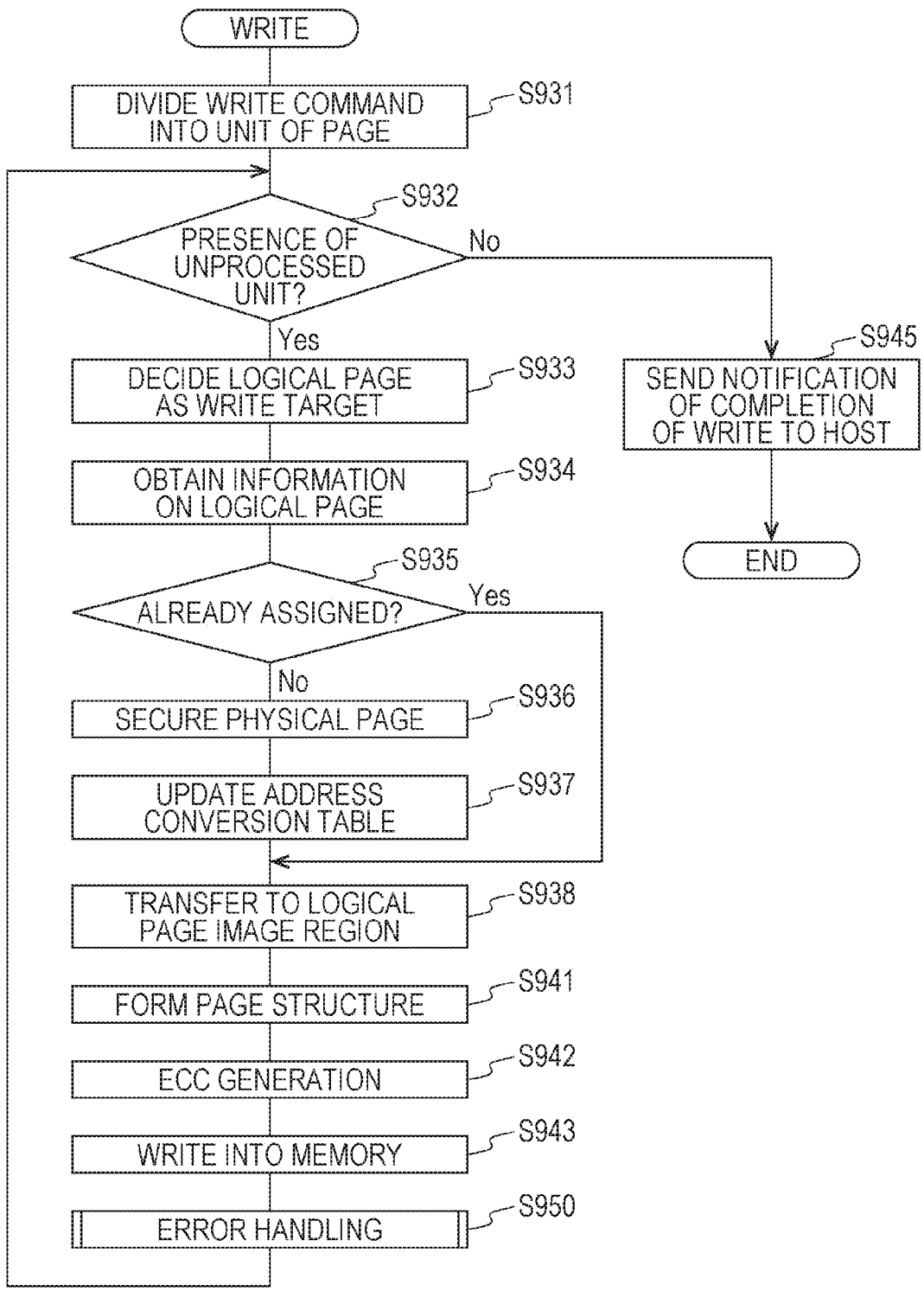
FIG. 12 is a flowchart illustrating an exemplary write operation of the storage control apparatus 200 according to an embodiment of the present technology.

FIG. 12 is a flowchart illustrating an exemplary write operation of the storage control apparatus 200 according to an embodiment of the present technology. First, the write command instructed from the host computer 100 is input into the storage control apparatus 200 via the host interface 210. The write command includes 'write address', 'write data size' and 'write data'. Among these, 'write data' are temporarily stored in the data buffer 263 of the RAM 260. Moreover, 'write address' is a logical address for the write target data. Herein, the position indicated by the write address is limited to the head of the logical page. Moreover, the write data size is limited to the multiple of the logical page size.

The control unit 240 divides the 'write address' and the 'write data size' constituting the write command into the unit of logical page as described above (step S931). Moreover, the control unit 240 calculates all the head addresses of individual regions discomposed for each of the logical pages, on the write data provided from the host computer 100 and temporarily stored in the data buffer 263. The following processing of step S932 or later is repeated for the logical page units obtained by dividing in step S931.

It is determined (step S932) whether there is a remaining logical page unit for which write processing is not yet processed among the logical page unit divided in step S931. In a case where there is no remaining write processing of the logical page unit (step S932: No), a notification of the end of write command processing is sent to the host computer 100 and the write operation is finished (step S945).

In contrast, in a case where there is remaining write processing of the logical page unit (step S932: Yes), one of the remaining write processing of the logical page unit is selected (step S933). Herein, it is assumed to select in the order from a younger logical page address. Subsequently, the information of the logical page corresponding to the selected read processing of the logical page unit is obtained from the address conversion table 262 (step S934).

Subsequently, it is confirmed whether a physical page is assigned to the logical page to be processed (step S935). Specifically, in a case where 'assignment status' is "already assigned" (step S935: Yes), the processing proceeds to step S938, and in a case where it is "not yet assigned" (step S935: No), the processing proceeds to step S936.

In a case where 'assignment status' is "not yet assigned", a physical page that is available is secured (step S936) on the basis of the blank page table 261. Specifically, an entry for which 'status of use' is "available" or "occurrence of writing error" is searched and a value of "in use" is inserted into 'status of use'. As described above, in a case where 'status of use' indicates "occurrence of writing error", this means that a write error has occurred in previous write toward the physical page. However, since the writing error occurs with a constant probability, there is a possibility that write would be successful in the next write. Note that, while there are methods such as selecting entry of "occurrence of writing error" after the entries of "available" are exhausted, description will be omitted herein. Moreover, when the physical page is secured, 'assignment status' is set to "already assigned" in a corresponding entry on the address conversion table 262 and the secured physical page address is set to 'physical page address' (step S937). Note that, while in a case where there is no physical page available on the blank page table 261, processing of sending a notification on this information to the host computer 100, or the like, is performed, description will be omitted herein.

Next, data of the data buffer 263 are transferred to the logical page image region 266 (step S938). Specifically, the 256 bytes for the logical page portion is transferred from the head address of each of the regions discomposed on the write data temporarily stored in the data buffer 263, to the logical page image region 266. Note that the head address of each of the regions is calculated in step S931.

The physical page image region 267 is formed (step S941) on the basis of the logical page image region 266 prepared by the above-described processing. Specifically, 256 bytes are read from the head of the logical page image region 266 and transferred to the physical page image region 267.

Next, the ECC processing unit 270 performs processing of generating an error correcting code (step S942). At that time, ahead address of the physical page image region 267 and an error correcting code (parity) generation instruction are given to the ECC processing unit 270. The ECC processing unit 270 reads 256 bytes from the head of the physical page image region 267, calculates 16 bytes of parity, and writes a result back to the physical page image region 267 to complete the physical page image region 267.

The content of the physical page image region 267 completed in this manner is written onto the memory 300 (step S943). At that time, the control unit 240 outputs, as a write request, a write instruction and the physical page address to the memory 300 via the memory interface 230. Herein, the physical page address is an address of a physical page read in step S934 or an address of a physical page newly assigned in step S936. The memory 300 writes received write data onto the physical page designated at the physical page address. After the write data are written, the following error handling is performed (step S950).

Figure 13:
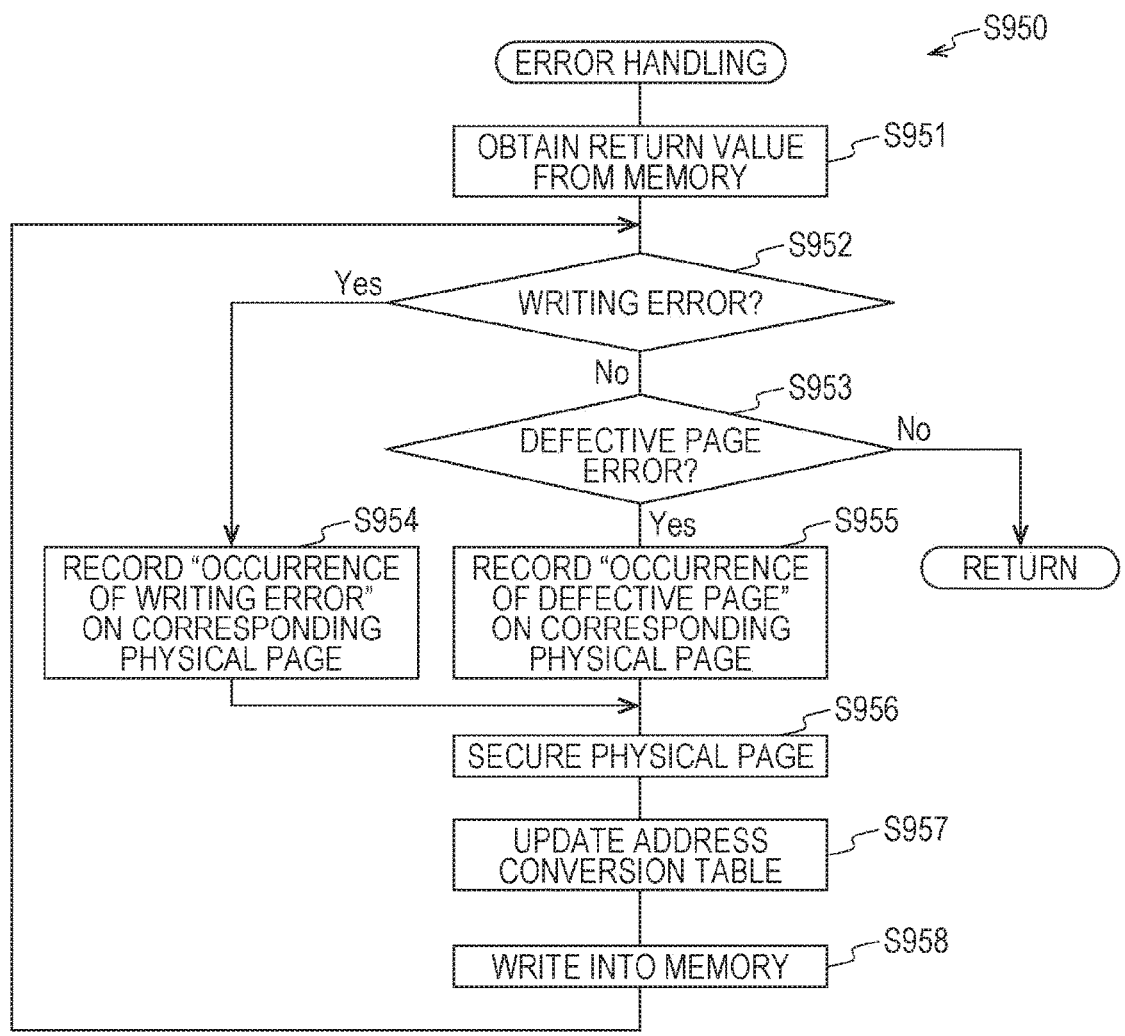
FIG. 13 is a flowchart illustrating an exemplary error handling operation of the storage control apparatus 200 according to the first embodiment of the present technology.

FIG. 13 is a flowchart illustrating an exemplary error handling operation of the storage control apparatus 200 according to the first embodiment of the present technology.

The control unit 240 waits for completion of the write operation on the memory 300 and obtains a post-execution status as a return value (step S951). Subsequently, the control unit 240 confirms whether the return value is 'writing error' (step S952).

In a case where the return value is 'writing error' (step S952: Yes), the control unit 240 writes a value of 'occurrence of write error' onto the entry that corresponds to the relevant physical page on the blank page table 261 (step S954).

In a case where the return value is not 'writing error' (step S952: No), the control unit 240 confirms whether the return value is 'defective page error' (step S953). In a case where the return value is not 'defective page error' (step S953: No), the error handling is finished and the processing of step S932 of later is repeated.

In a case where the return value is 'defective page error' (step S953: Yes), the control unit 240 writes a value of 'occurrence of defective page' onto the entry that corresponds to the relevant physical page on the blank page table 261 (step S955).

After the occurrence of the error is written onto the blank page table 261 in step S954 or step S955, the control unit 240 secures a physical page that is available, on the basis of the blank page table 261 (step S956). Subsequently, 'assignment status' is set to "already assigned" in a corresponding entry on the address conversion table 262 and the secured physical page address is set to 'physical page address' (step S957). Thereafter, the content of the physical page image region 267 is written onto the memory 300 (step S958). Processing of these steps S956 to S958 is similar to the processing of step S936, S937 and S943.

Figure 14:
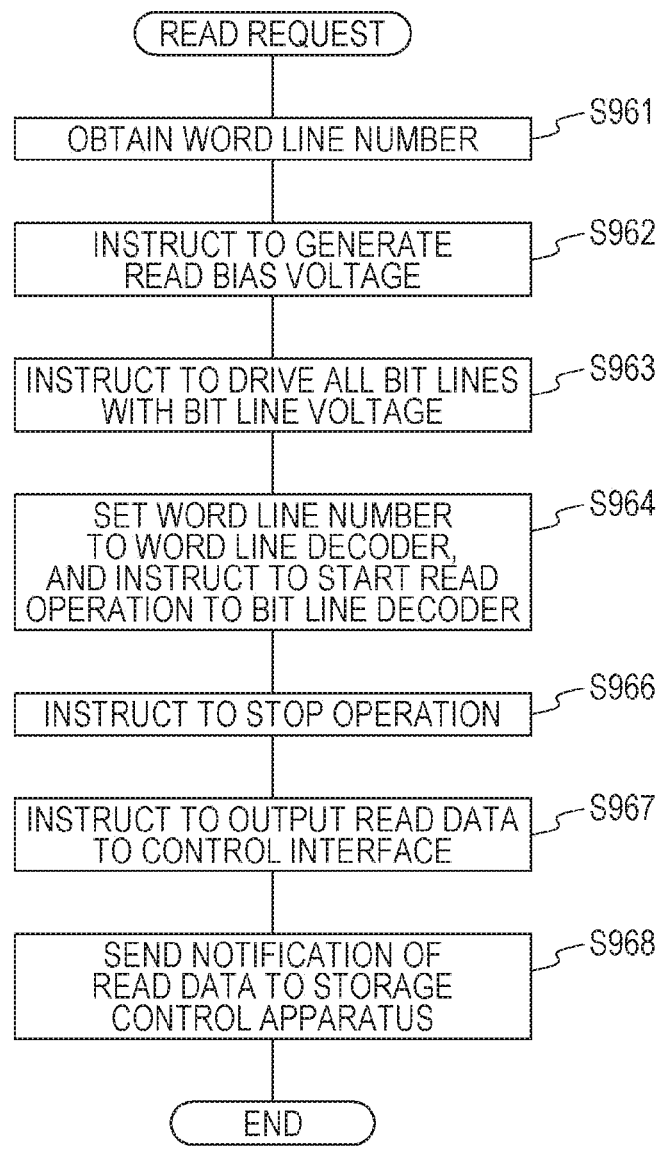
FIG. 14 is a flowchart illustrating an exemplary operation of read processing of the memory 300 according to an embodiment of the present technology.

FIG. 14 is a flowchart illustrating an exemplary operation of read processing of the memory 300 according to an embodiment of the present technology. Herein, it is assumed that the word line number WL_0 is designated as a physical page address that is a component of the read request from the storage control apparatus 200 to the memory 300.

First, the control unit 380 obtains, from the control interface 310, a physical page address that is a component of the read request (step S961). Herein, the word line number WL_0 is obtained as a physical page address, as described above.

The control unit 380 sends the driver 350 an instruction to generate the voltage bias on the read operation (step S962). Specifically, setting is performed such that the bit line voltage is set to '+Vread' with respect to the plate voltage. The plate 333 of the memory cell 330 is driven by the plate voltage supplied from the driver 350.

The control unit 380 sends the bit line selector 340 an instruction to drive all bit lines with the bit line voltage (step S963). In accordance with the instruction from the control unit 380, the bit line selector 340 supplies the bit line voltage supplied from the driver 350, to all the bit lines.

The control unit 380 sets the physical page address (word line number WL_0) designated at the read request onto the word line decoder 320 and sends the bit line selector 340 an instruction to start the read operation (step S964). The word line decoder 320 drives the word line (WL_0) that corresponds to the designated physical page address (word line number WL_0), with a logical value 'H'. With this operation, an access transistor connected with the WL_0 becomes conductive and the voltage bias in the read operation, generated on the driver 350, is applied to the variable resistance element. Therefore, the current corresponding to either the high resistive state or the low resistive state, in each of the elements, flows into the bit line selector 340 through the bit line. The bit line selector 340 measures the incoming amperage, thereby deciding logic '0' or '1' corresponding to each of the variable resistance elements. With this operation, the logical state of the variable resistance element connected to the designated physical page address (WL_0) is read by the bit line selector 340.

When the reading is completed, the control unit 380 sends an instruction to stop the read operation, toward the bit line selector 340 (step S966). That is, setting of the physical page address toward the word line decoder 320 is canceled, the bit line drive instruction toward the bit line selector 340 is canceled, and instruction to stop generation of the voltage bias is sent toward the driver 350. Note that it is conceivable that there are cases where the read completion timing is decided by a clock incorporated in the control unit 380, and a case where the timing is decided by confirming that the sufficient amperage has been secured on the bit line selector 340. Herein, however, detailed description will be omitted.

The control unit 380 sends the control interface 310 an instruction to output the data read by the bit line selector 340 (step S967). Subsequently, the control unit 380 sends an instruction to the control interface 310 so as to notify the storage control apparatus 200 of the data that have been read (step S968).

Figure 15:
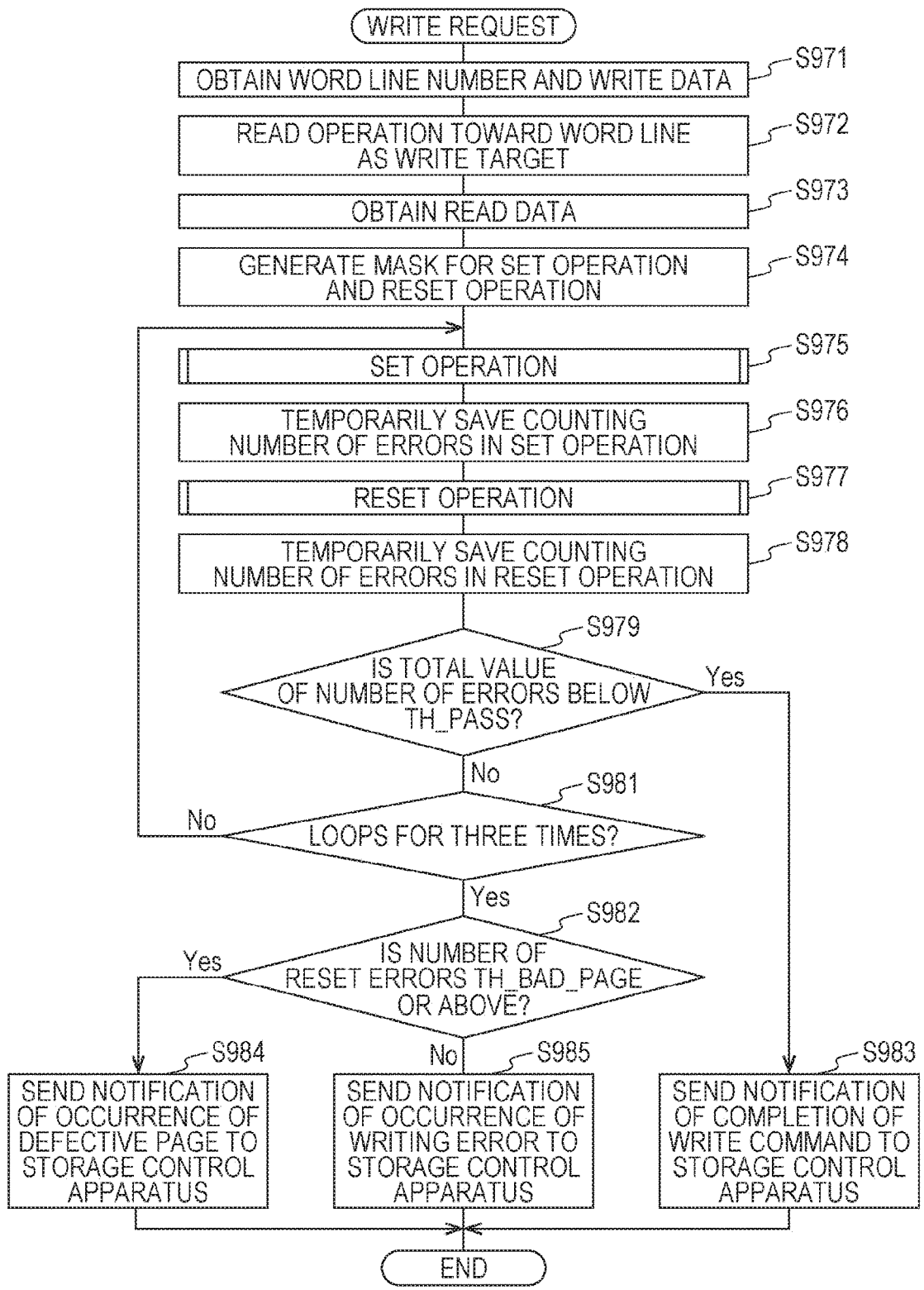
FIG. 15 is a flowchart illustrating an exemplary operation of read processing of the memory 300 according to the first embodiment of the present technology.

FIG. 15 is a flowchart illustrating exemplary operation of write processing of the memory 300 in the first embodiment of the present technology. Herein, it is assumed that WL_0 is designated as a physical page address that is a component of the write request from the storage control apparatus 200 to the memory 300 and that a value '6' ('00000110' in binary notation) is designated as data for writing.

Moreover, it is assumed as a status before performing write, that a value '3' ('00000011' in binary notation) is recorded in a bit group that corresponds to WL_0 on the memory cell 330. When these are observed for each of bits, it is necessary, in bits corresponding to BL_0, to change the current logical value '1' into the logical value '0'. For bits corresponding to BL_1, it is not necessary to change the current logical value '1' to any other. It is necessary, in bits corresponding to BL_2, to change the current logical value '0' into the logical value '1'. For bits corresponding to BL_7 to BL_3, it is not necessary to change the current logical value '0' to any other.

In writing onto a non-volatile memory including a ReRAM, one common method to prevent unnecessary bit inversion and rewrite would be to compare recorded information with the information to write and to perform necessary minimum bit inversion. That is, in this exemplary case, it is preferable that a bit inversion operation is selectively performed onto the bit corresponding to BL_0 and the bit corresponding to BL_2, while maintaining other bits as they are. Accordingly, in the following embodiment, information for the position of writing is first read, and the bit to be inverted is decided, and the bit inversion operation is performed selectively to the decided bits.

The control unit 380 obtains physical page address that is a component of the write request, and data to write from the control interface 310 (step S971). Herein, WL_0 is obtained as a physical page address, as described above.

The control unit 380 performs processing of steps S962 to S966 described in FIG. 14 and reads a value currently recorded at the bit that corresponds to the designated physical page address (WL_0) (step S972). The control unit 380 accesses the bit line selector 340 and obtains the data read from the memory cell 330 (step S973).

The control unit 380 compares the data read from the memory cell 330 with the write data to write and decides the bits to undergo the set operation and bits to undergo the reset operation (step S974). That is, the control unit 380 generates, at this step, generates '00000100' in binary representation in which the value '1' is assigned to BL_2 alone, as a bit pattern (set mask) to undergo the set operation. Moreover, at this step, '00000001' in binary representation is generated in which the value '1' is assigned to BL_0 alone, as a bit pattern (reset mask) to undergo the reset operation.

Thereafter, the control unit 380 performs a set operation (step S975). Execution processing procedure for the set operation will be described below. The control unit 380 compares the data that have been read, with the bit pattern (set mask) to undergo the set operation. The number of bits for which the set operation has not been performed properly is counted and temporarily retained as the number of set errors (step S976). Moreover, the set mask is corrected such that the bits for which the set operation has not been performed properly remain at the set mask.

Moreover, the control unit 380 performs a reset operation (step S977). Execution processing procedure for the reset operation will be described below. The control unit 380 compares the data that have been read, with the bit pattern (reset mask) to undergo the reset operation. The number of bits for which the reset operation has not been performed properly is counted and temporarily retained as the number of reset errors (step S978). Moreover, the reset mask is corrected such that the bits for which the reset operation has not been performed properly remain at the reset mask.

The control unit 380 calculates the sum (total value) of the number of set errors generated in step S976 and the number of reset errors generated in step S978 and confirms (step S979) whether the value is below a predetermined threshold (TH_PASS). In a case where the sum value is below the threshold (step S979: Yes), a notification that the write command has been properly finished is sent to the storage control apparatus 200 via the control interface 310 (step S983). In this case, it is defined as a proper completion by that fact that the sum of the number of set errors and the number of reset errors is below the threshold (TH_PASS) after write attempts of three times or less.

Note that it is possible to judge that it is a proper completion in a case where the number of writing errors is zero, by setting the threshold (TH_PASS) in step S979 to '1'. Moreover, it is also possible to set a numerical value other than '1', that is, the number of errors correctable at ECC. For example, even when the sum of the number of errors after write attempts for three times is two, it is correctable by the ECC. Accordingly, it is allowable to judge that the write has been properly completed.

In a case where the sum is a threshold or above (step S979: No), the control unit 380 confirms whether the passage through the loop is the third passage (step S981). In a case where the passage through the loop is the first or second passage (step S981: No), processing returns to step S975 and processing is repeated. In a case where the passage of the loop is the third passage (step S981: Yes), this means the standard has not been satisfied even with three times of attempts, and thus, write is not attempted any more and the processing proceeds to step S982.

The control unit 380 compares (step S982) the number of reset errors previously generated in step S978 with a previously set threshold (TH_BAD_PAGE). In a case where the number of reset errors is below the threshold (step S982: No), this is judged to be a simple writing error and a notification of the occurrence of the writing error is sent to the storage control apparatus 200 (step S985) via the control interface 310. In this case, the judgment is such that, even with three times of write attempts, since the sum of the number of set errors and the number of reset errors is the threshold (TH_PASS) or above and the number of reset errors is below the threshold (TH_BAD_PAGE), this is a writing error but not a physical page defect.

In contrast, in a case where the number of reset errors is the threshold or above (step S982: Yes), the judgment is such that the page indicated by the physical page address is defective and a notification of the occurrence of the defective page is sent to the storage control apparatus 200 via the control interface 310 (step S984). In this case, the judgment is such that, even with three times of write attempts, since the sum of the number of set errors and the number of reset errors is the threshold (TH_PASS) or above and the number of reset errors is the threshold (TH_BAD_PAGE) or above, the corresponding physical page is a defective page.

Figure 16:
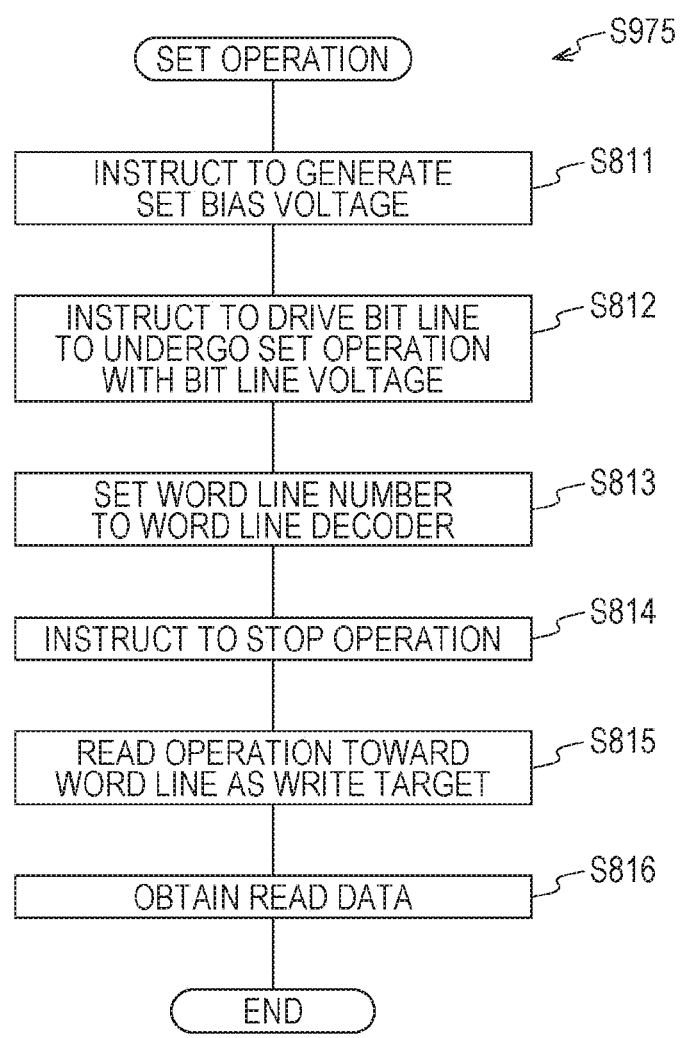
FIG. 16 is a flowchart illustrating an exemplary operation of a set operation (step S975) of the memory 300 according to an embodiment of the present technology.

FIG. 16 is a flowchart illustrating an exemplary set operation (step S975) of the memory 300 according to an embodiment of the present technology.

The control unit 380 sends the driver 350 an instruction to generate the voltage bias at the set operation (step S811). Specifically, setting is performed such that the plate voltage is set to '+Vset' with respect to the bit line voltage. The plate of the memory cell 330 is driven by the plate voltage supplied from the driver 350.

The control unit 380 gives the bit line selector 340 a cell pattern to undergo the set operation and instructs that the bit line corresponding to the value '1' be driven by the bit line voltage and the bit line corresponding to the value '0' be driven by the plate voltage (step S812). In accordance with the instruction from the control unit 380, the bit line selector 340 supplies the bit line voltage or the plate voltage supplied from the driver 350.

Herein, the cell pattern to undergo the set operation in the case of executing step S812 for the first time is the set mask '00000100' generated in step S974. That is, BL_2 alone is driven by the bit line voltage and the other bit lines (BL_7 to BL_3, BL_1, and BL_0) are driven by the plate voltage. In execution of step S812 for the second time or later, the set mask to be used is the set mask that sets the bit for which it is found that the set operation has not been properly performed in step S976, to '1'.

The control unit 380 sets the physical page address (WL_0) designated at the write request, onto the word line decoder 320 (step S813). The word line decoder 320 drives the word line (WL_0) that corresponds to the designated physical page address (WL_0), with a logical value 'H'. With this operation, the access transistor connected with WL_0 becomes conductive.

At this time, the plate 333 of the memory cell 330 is driven by the plate voltage supplied from the driver 350 and BL_2 is driven by the bit line voltage with the setting in the step S812. This is the voltage bias necessary for the set operation, and thus, the set operation is performed toward the variable resistance element connected to the intersection of WL_0 and BL_2. In contrast, BL_7 to BL_3, BL_1 and BL_0 are driven by the plate voltage by the setting in step S812. Therefore, potential difference does not occur at the both sides of the variable resistance element even when the access transistor becomes conductive, and thus, the bit inversion operation is not performed.

The control unit 380 cancels the setting of the physical page address toward the word line decoder 320, cancels the bit line drive instruction toward the bit line selector 340, and sends an instruction to stop generation of the voltage bias toward the driver 350 (step S814). Note that it is conceivable, for example, to decide the set operation completion timing with a clock incorporated in the control unit 380, or the like. Herein however, detailed description will be omitted.

The control unit 380 performs processing similar to step S972 in FIG. 15 and reads a value currently recorded at the bit that corresponds to the designated physical page address (WL_0) (step S815). The control unit 380 accesses the bit line selector 340 and obtains the data read from the memory cell 330 (step S816).

Figure 17:
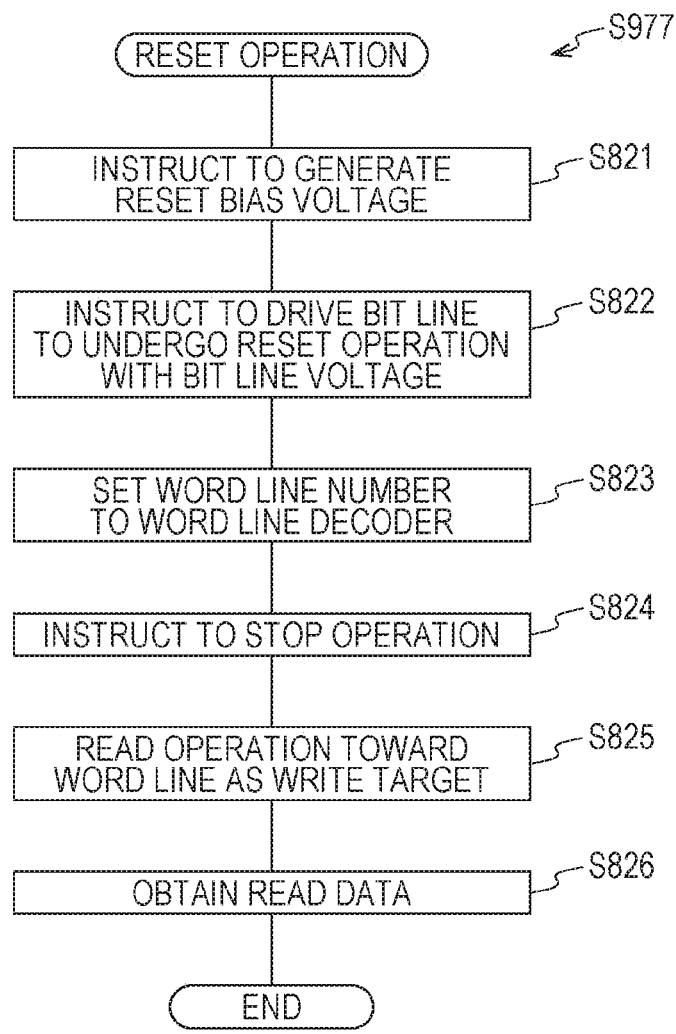
FIG. 17 is a flowchart illustrating an exemplary operation of a reset operation (step S977) of the memory 300 according to an embodiment of the present technology.

FIG. 17 is a flowchart illustrating an exemplary reset operation (step S977) of the memory 300 according to an embodiment of the present technology.

The control unit 380 sends the driver 350 an instruction to generate the voltage bias at the reset operation (step S821). Specifically, setting is performed such that the bit line voltage is set to '+Vreset' with respect to the plate voltage. The plate of the memory cell 330 is driven by the plate voltage supplied from the driver 350.

The control unit 380 gives the bit line selector 340 a cell pattern to undergo the reset operation and instructs that the bit line corresponding to the value '1' be driven by the bit line voltage and the bit line corresponding to the value '0' be driven by the plate voltage (step S822). In accordance with the instruction from the control unit 380, the bit line selector 340 supplies the bit line voltage or the plate voltage supplied from the driver 350.

Herein, the cell pattern to undergo the reset operation in the case of executing step S822 for the first time is the reset mask '00000001' generated in step S974. That is, BL_0 alone is driven by the bit line voltage and the other bit lines (BL_7 to BL_1) are driven by the plate voltage. In execution of step S822 for the second time or later, the reset mask to be used is the reset mask that sets the bit for which it is found that the reset operation has not been properly performed in step S978, to '1'.

The control unit 380 sets the physical page address (WL_0) designated at the write request, onto the word line decoder 320 (step S823). The word line decoder 320 drives the word line (WL_0) that corresponds to the designated physical page address (WL_0), with a logical value 'H'. With this operation, the access transistor connected with WL_0 becomes conductive. At this time, the plate 333 of the memory cell 330 is driven by the plate voltage supplied from the driver 350 and BL_0 is driven by the bit line voltage set in the step S822. This is the voltage bias necessary for the reset operation, and thus, the reset operation is performed toward the variable resistance element connected to the intersection of WL_0 and BL_0. In contrast, BL_7 to BL_1 are driven by the plate voltage set in step S822. Therefore, potential difference does not occur at the both sides of the variable resistance element even when the access transistor becomes conductive, and thus, the bit inversion operation is not performed.

The control unit 380 cancels the setting of the physical page address toward the word line decoder 320, cancels the bit line drive instruction toward the bit line selector 340, and sends an instruction to stop generation of the voltage bias toward the driver 350 (step S824). Note that it is conceivable, for example, to decide the reset operation completion timing with a clock incorporated in the control unit 380, or the like. Herein however, detailed description will be omitted.

The control unit 380 performs processing similar to step S972 in FIG. 15 and reads a value currently recorded at the bit that corresponds to the designated physical page address (WL_0) (step S825). The control unit 380 accesses the bit line selector 340 and obtains the data read from the memory cell 330 (step S826).

Figure 18:
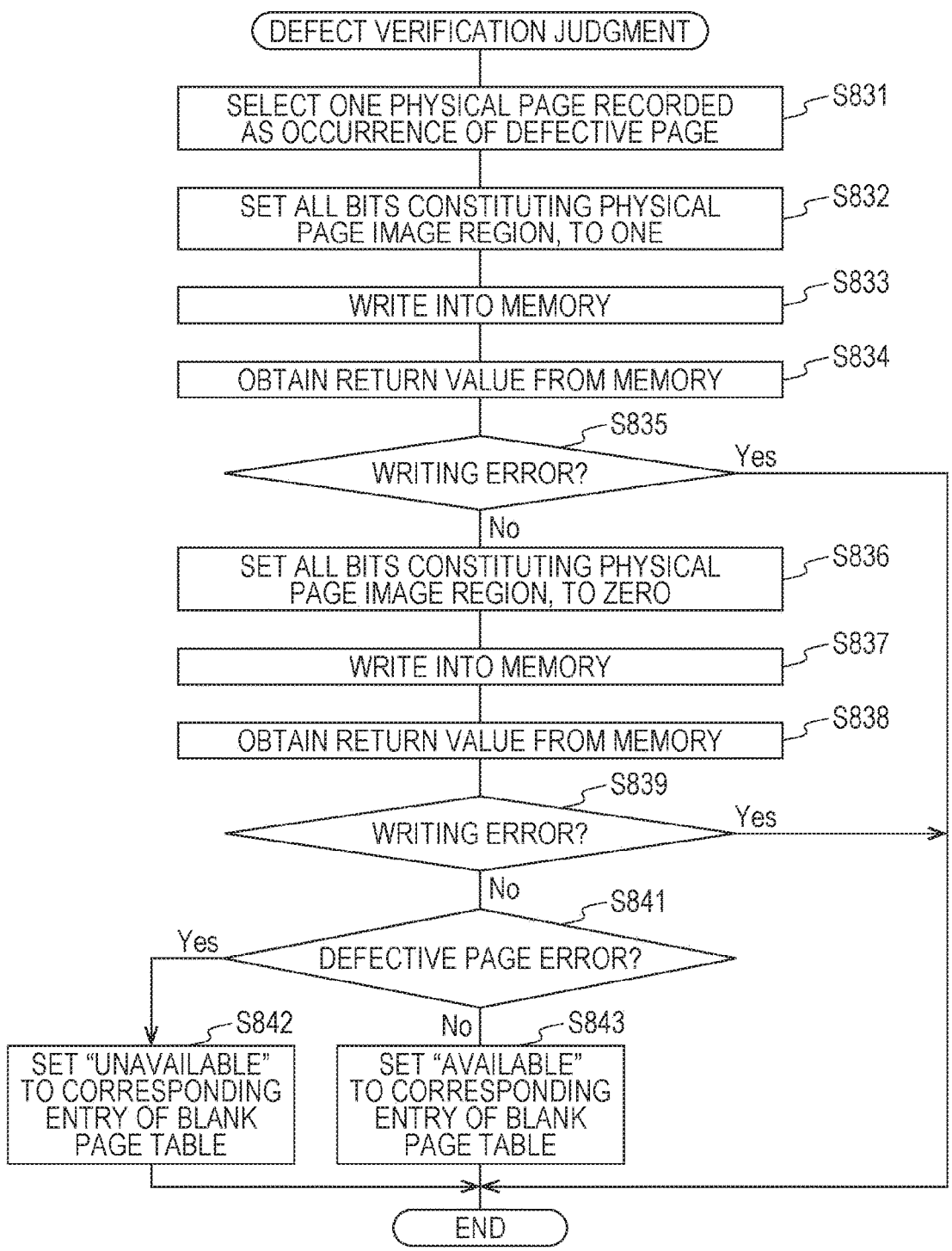
FIG. 18 is a flowchart illustrating exemplary defective page verification processing of the storage control apparatus 200 according to an embodiment of the present technology.

FIG. 18 is a flowchart illustrating exemplary defective page verification processing of the storage control apparatus 200 according to an embodiment of the present technology. In a case where the number of entries recorded on the blank page table 261 as 'occurrence of defective page' has exceeded a fixed number, the control unit 240 of the storage control apparatus 200 reconfirms the physical page having the attribute of 'occurrence of defective page'. That is, it is judged whether the physical page is determined as 'unavailable', or determined as 'available' after judgment as 'reusable'. The judgment timing can be the timing designated from the host computer 100, or the timing judged as blank time on the storage control apparatus 200.

The control unit 240 selects one entry recorded as 'occurrence of defective page', on the blank page table 261 (step S831). In the present embodiment, it is preferable to select one entry with a random selection method, from among a plurality of entries recorded as 'occurrence of defective page'.

The control unit 240 sets all the bits constituting the physical page image region 267 to '1' (step S832) for the physical page of the entry selected in step S831. That is, '0xFF' is filled into all of 272 bytes. Thereafter, the control unit 240 writes the content of the physical page image region 267 onto the memory 300 (step S833). This write processing is similar to the processing in step S943.

The control unit 240 waits for completion of the write operation on the memory 300 and obtains a post-execution status as a return value (step S834). Subsequently, the control unit 240 confirms whether the return value is 'writing error' (step S835).

In a case where this is a writing error (step S835: Yes), the defective page verification processing is finished without changing the blank page table 261. In a case where this is not a writing error (step S835: No), processing proceeds to step S836. Note that all bits of the data to be written are '1' in writing in step S833, and thus, the reset operation does not occur. Accordingly, a defective page error associated with the reset operation does not occur.

Next, the control unit 240 sets all the bits constituting the physical page image region 267 to '0' (step S836) for the physical page of the entry selected in step S831. That is, '0x00' is filled into all of 272 bytes. Thereafter, the control unit 240 writes the content of the physical page image region 267 onto the memory 300 (step S837). This write processing is similar to the processing in step S943.

The control unit 240 waits for completion of the write operation on the memory 300 and obtains a post-execution status as a return value (step S838). Subsequently, the control unit 240 confirms whether the return value is 'writing error' (step S839).

In a case where this is a writing error (step S839: Yes), the defective page verification processing is finished without changing the blank page table 261. In a case where this is not a writing error (step S839: No), the control unit 240 confirms whether the return value is 'defective page error' (step S841).

In a case where this is a defective page error (step S841: Yes), the control unit 240 sets 'unavailable' to the corresponding entry on the blank page table 261 (step S842). In contrast, in a case where this is not a defective page error (step S841: No), the control unit 240 sets 'available' to the corresponding entry on the blank page table 261 (step S843).

Herein, in a case where the defective page verification processing is finished without changing the blank page table 261 (step S835: Yes, or step S839: Yes), the corresponding physical page remains with a record of 'occurrence of defective page'. In this case, judgment is to be performed again in the defective page verification processing performed in the future.

Herein, a procedure of writing all-bit '0' data after writing all-bit '1' data is used. This is a procedure for performing the reset operation for all bits. On the memory 300, the set operation is performed toward the bit with the value '0' on the corresponding physical page and '1' is written onto the bit (step S833), while the reset operation is performed toward all the bits on the corresponding physical page and '0' is written onto the bit (step S837). That is, whether to verify the page as a defective page is decided by the number of reset errors at the time of reset operation performed for all the bits of the corresponding physical page.

Note that, in a case where the threshold (TH_BAD_PAGE) can be changed from the storage control apparatus 200, it is conceivable to set the threshold a little higher prior to the writing in step S837 and to return to the original threshold after completion. This is due to a point of view that, in comparison of the threshold for detecting a defective page candidate in ordinary writing with the threshold for deciding the defective page in the defective page verification processing, it is desirable to use a lower threshold for the former threshold in order to make it easier to be judged as a defective page. That is, the defective page verification processing is performed to judge whether it is a defective page with a high standard that makes it more difficult to judge as a defective page than in a case where the defective page candidate is detected in ordinary writing.

Moreover, there is another method whereby an instruction 'invert designated physical address value and send a notification of the number of reset errors' is issued twice to the memory 300, two sets of numbers of reset errors notified by two times of instructions are added so as to judge whether it is a defective page.

In this manner, according to the first embodiment of the present technology, the number of reset errors is counted on the memory 300 and the defective page candidate is detected on the basis of the number, making it possible to judge, thereafter, whether the page is available on the storage control apparatus 200. Note that, while the first embodiment detects the occurrence of the defective page by focusing on the number of reset errors, it is also allowable to perform similar detection by focusing on the number of set errors.

2. Second Embodiment

The above-described first embodiment detects the defective page candidate by counting the number of reset errors on the memory 300. In contrast, a second embodiment judges a defective page on the storage control apparatus 200. Note that since fundamental hardware configuration is similar to the above-described configuration, detailed description will be omitted.

[Functional Configuration]

Figure 19:
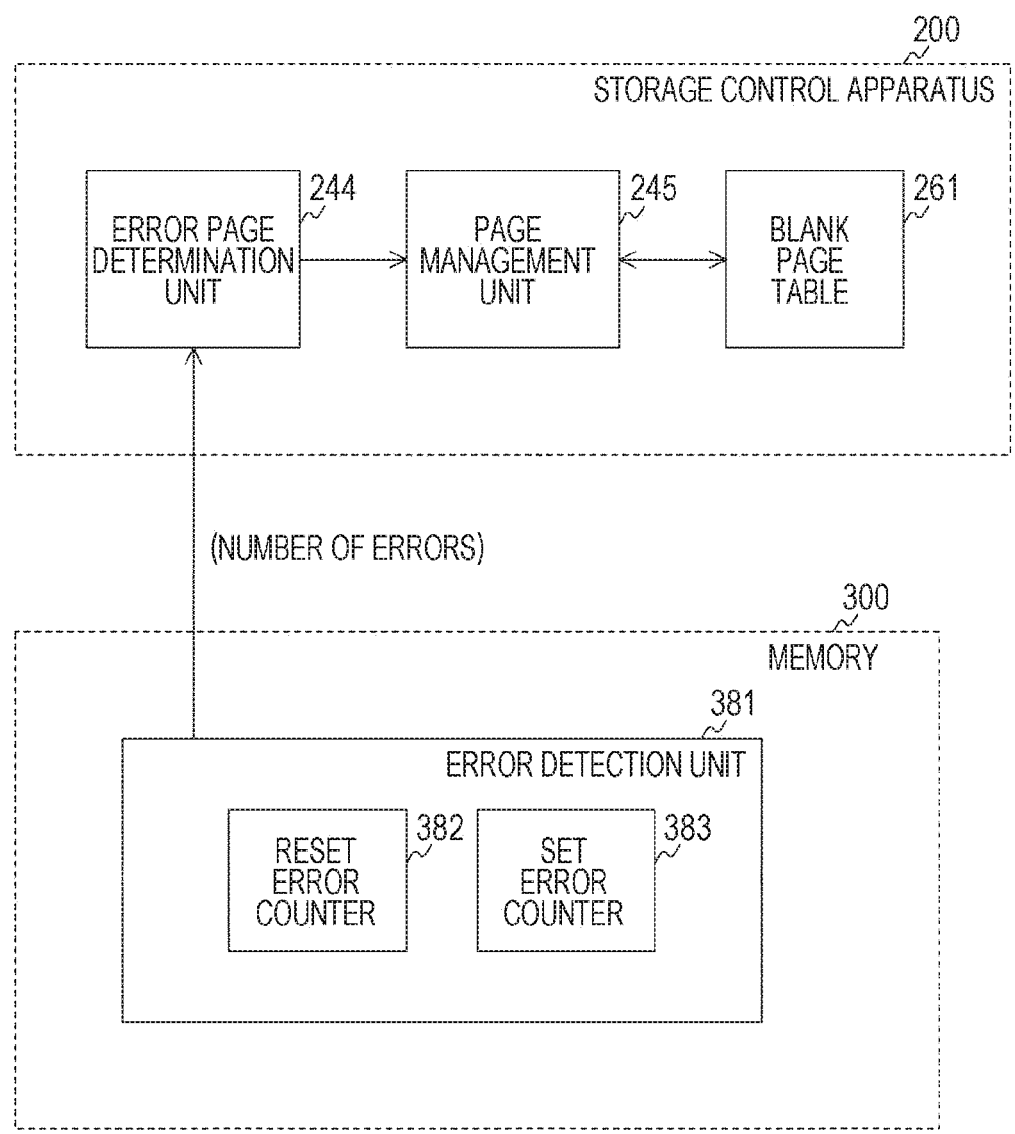
FIG. 19 is a diagram illustrating an exemplary functional configuration of an information processing system according to a second embodiment of the present technology.

FIG. 19 is a diagram illustrating an exemplary functional configuration of an information processing system according to the second embodiment of the present technology. Fundamental functional configuration is similar to the case of the above-described first embodiment, except that the storage control apparatus 200 includes an error page determination unit 244.

That is, in the second embodiment, a notification of the number of reset errors and the number of set errors counted on the error detection unit 381 is sent from the memory 300 to the storage control apparatus 200. Subsequently, the error page determination unit 244 that receives the number of errors detected on the error detection unit 381 determines the error occurrence state by a unit of page, on the basis of the number of errors. A determination result from the error page determination unit 244 is supplied to the page management unit 245, and the page management unit 245 feeds back the determination result to the blank page table 261.

For example, the total value of the number of reset errors and the number of set errors counted on the error detection unit 381 is the threshold (TH_PASS) or above, a notification of a writing failure and a notification of the number of reset errors and the number of set errors are sent from the memory 300 to the storage control apparatus 200. In a case where the notification of the writing failure has been sent, the error page determination unit 244 determines that the defective page error has occurred when the last number of reset errors is the threshold (TH_BAD_PAGE) or above. In contrast, when the last number of reset errors is below the threshold (TH_BAD_PAGE), the error page determination unit 244 determines that a simple writing error has occurred. The page management unit 245 feeds back the determination result by the error page determination unit 244 to the blank page table 261. Note that the error page determination unit 244 is an exemplary determination unit described in attached claims.

Moreover, similarly to the first embodiment, the page management unit 245 reconfirms the physical page having an attribute of 'occurrence of defective page'. This enables judgement whether it is possible to use a page after once determined as the page with the occurrence of defective page.

[Operation of Information Processing System]

In the second embodiment, fundamental processing procedures of the read operation and the write operation are similar to the case of the above-described first embodiment. However, as described below, error handling on the storage control apparatus 200 in step S950 and write request processing on the memory 300 differ from the case of the first embodiment.

Figure 20:
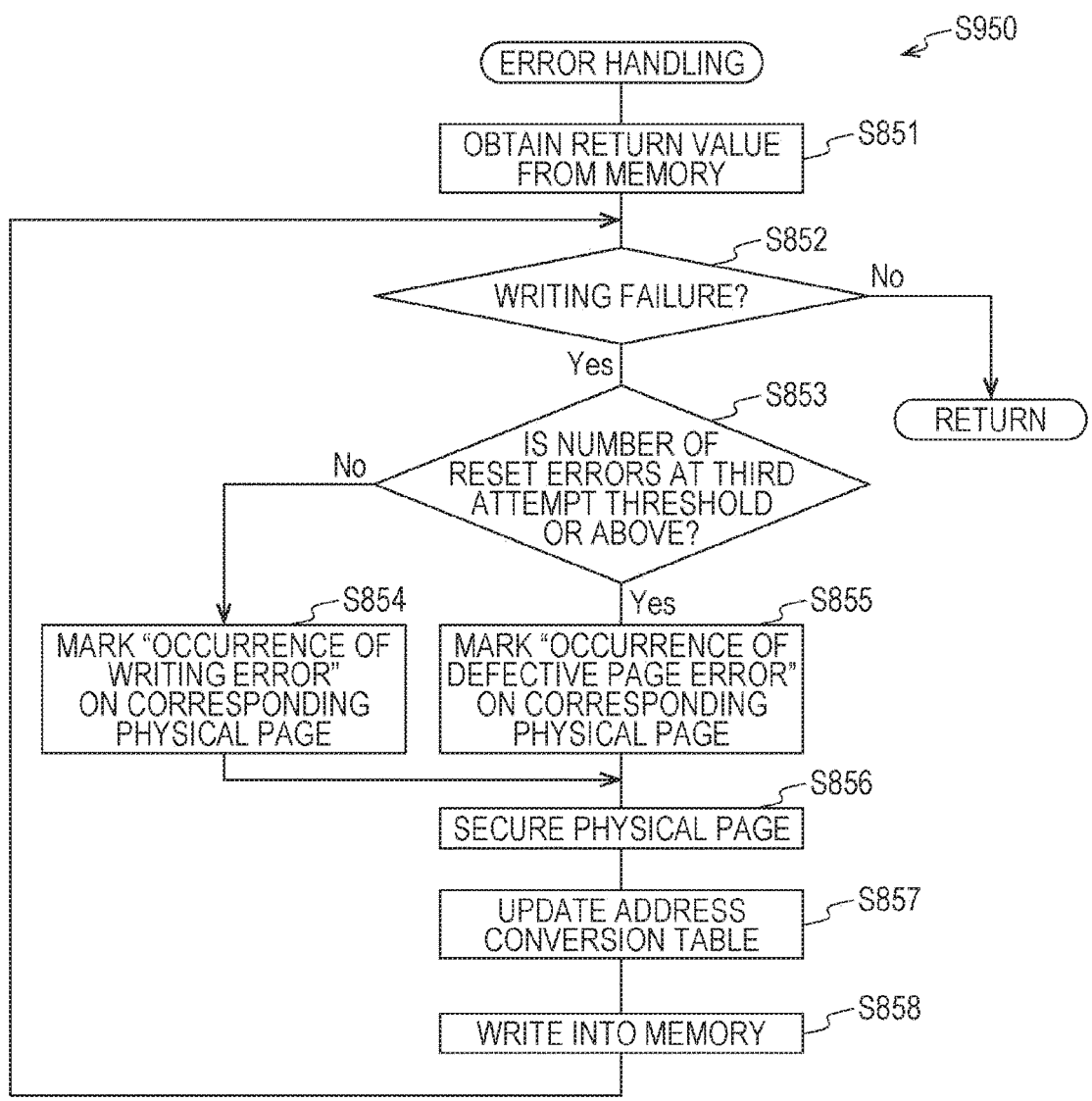
FIG. 20 is a flowchart illustrating an exemplary error handling operation of the storage control apparatus 200 according to the second embodiment of the present technology.

FIG. 20 is a flowchart illustrating an exemplary error handling operation of the storage control apparatus 200 according to the second embodiment of the present technology.

The control unit 240 waits for completion of a write operation on the memory 300 and obtains a post-execution status as a return value (step S851). Subsequently, the control unit 240 confirms whether the return value is 'writing failure' (step S852). In a case where it is not 'writing failure' (step S852: No), the error handling is finished and processing of step S932 or later is repeated.

In the return value is 'writing failure' (step S852: Yes), the third (last) number of reset errors is compared with the threshold (TH_BAD_PAGE) (step S853). In a case where the number of reset errors is below the threshold (step S853: No), the control unit 240 judges that it is a simple writing error and writes a value of 'occurrence of write error' into the entry that corresponds to the physical page on the blank page table 261 (step S854). In contrast, in a case where the number of reset errors is the threshold or above (step S853: Yes), the control unit 240 judges that it is a defective page and writes a value of 'occurrence of defective page error' into the entry that corresponds to the physical page on the blank page table 261 (step S855).

Note that processing of step S856 or later is similar to the above-described processing of step S956 or later.

Herein, whether it is a defective page or a simple writing error is judged by selectively focusing on the third (last) number of reset errors. It is, however, also possible to judge this by using three sets of numbers of reset errors, or using three sets of numbers of reset errors and set errors. For example, this makes it possible for the storage control apparatus 200 to independently perform judgment such that the page is a defective page in a case where the first or second number of reset errors is greater than a predetermined threshold even when the third (last) number of reset errors is below the threshold (TH_BAD_PAGE).

Figure 21:
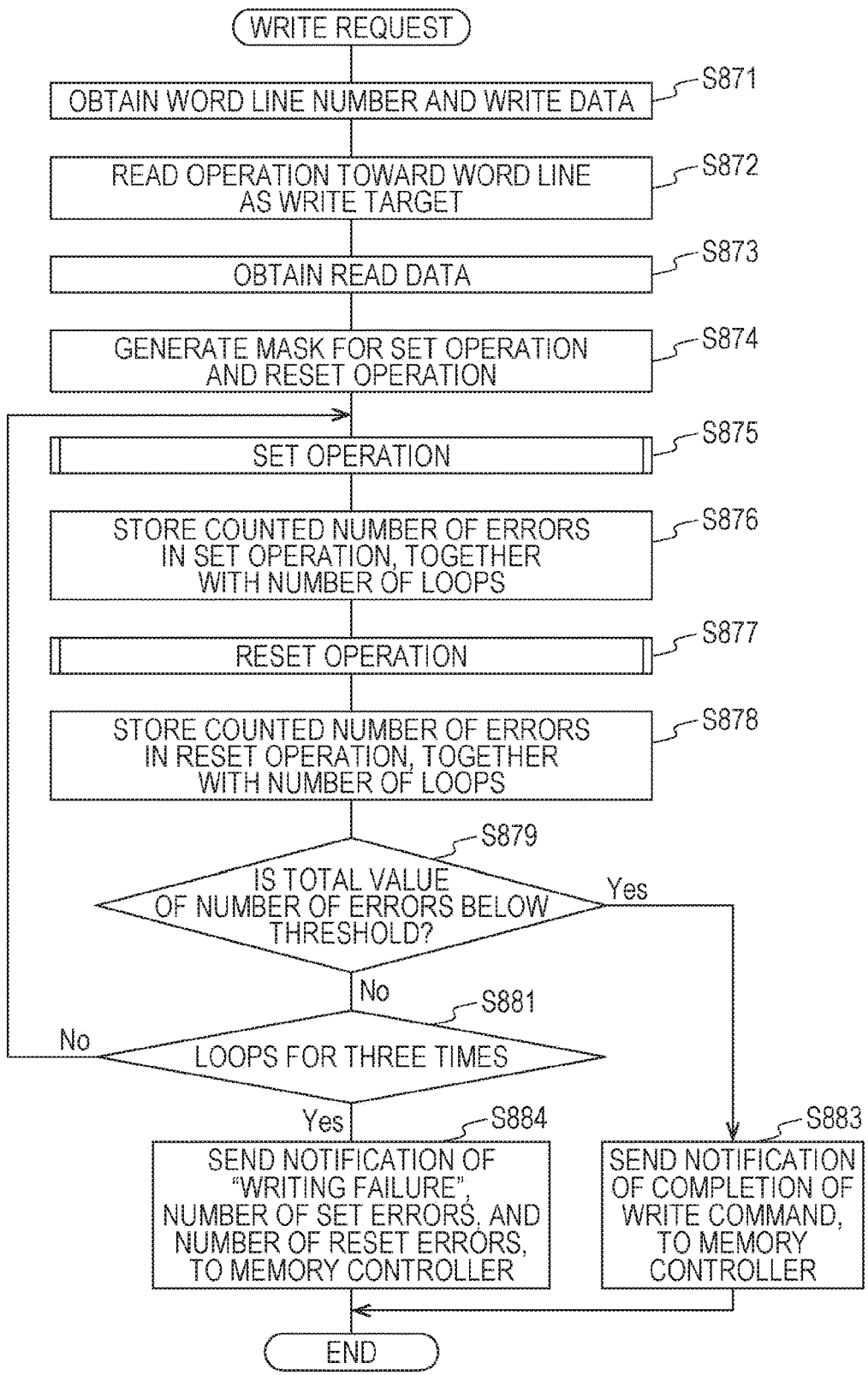
FIG. 21 is a flowchart illustrating an exemplary operation of read processing of the memory 300 according to the second embodiment of the present technology.

FIG. 21 is a flowchart illustrating an exemplary operation of read processing of the memory 300 according to the second embodiment of the present technology. In the diagram, processing of steps S871 to S875, S877, S879, S881 and S883 is similar to the above-described processing of steps S971 to S975, S977, S979, S981 and S983.

After the set operation (step S875) is performed, the control unit 380 compares the data that have been read, with a bit pattern (set mask) to undergo the set operation. Subsequently, the number of bits for which the set operation has not been performed properly is counted and stored as the number of set errors, together with the number of loops (step S876). Moreover, the set mask is corrected such that the bits for which the set operation has not been performed properly remain at the set mask. Although merely the number of set errors is temporarily stored in the above-described step S976, it is stored together with the number of loops in this step S876. With this operation, the number of set errors, three sets at the maximum, is stored together with the number of loops.

After the reset operation (step S877) is performed, the control unit 380 compares the data that have been read, with a bit pattern (reset mask) to undergo the reset operation. Subsequently, the number of bits for which the reset operation has not been performed properly is counted and stored as the number of reset errors, together with the number of loops (step S878). Moreover, the reset mask is corrected such that the bits for which the reset operation has not been performed properly remain at the reset mask. Although merely the number of reset errors is temporarily stored in the above-described step S978, it is stored together with the number of loops in this step S878. With this operation, the number of reset errors, three sets at the maximum, is stored together with the number of loops.

In a case where the passage of the loop is the third passage (step S881: Yes), the control unit 380 sends a notification of a write request failure to the storage control apparatus 200 (step S884) via the control interface 310. Moreover, at this time, the control unit 380 sends as a notification of a total of six values including the three sets of the numbers of set errors and three sets of the numbers of reset errors, to the storage control apparatus 200 (step S884) via the control interface 310.

Note that three sets of the numbers of set errors and three sets of the numbers of reset errors are sent as a notification, it is also allowable to limit this to parameters used in the storage control apparatus 200. For example, it is allowable to send three sets of the numbers of reset errors, or send the last number of reset errors, as the notification.

Moreover, even when the write request has been completed properly, it is possible to send a notification of the number of loops and the three sets of the numbers of set errors and reset errors at the maximum, to the storage control apparatus 200, in step 883. After receiving these sets of information, the storage control apparatus 200 examines the number of loops and the three sets of the numbers of set errors and the numbers of reset errors at the maximum, and the storage control apparatus 200 can decide, on its own judgment, whether it is a writing error or a defective page error. For example, this makes it possible for the storage control apparatus 200 to independently perform judgment such as determining that the page is a defective page in a case where the first or second number of errors is greater than a predetermined threshold even when the third number of errors is small due to successful writing in the three loops.

In this manner, according to the second embodiment of the present technology, the number of reset errors is counted on the memory 300, making it possible to judge the occurrence of the defective page and availability of the page on the basis of the number, on the storage control apparatus 200.

Note that the above-described first embodiment assumes that the page management unit 245 is provided outside the memory 300, and the second embodiment assumes that the error page determination unit 244 is further provided outside the memory 300. It is allowable, however, to configure such that a configuration equivalent to the page management unit 245 and the error page determination unit 244 is incorporated into the memory 300 and the memory 300 itself performs management of the defective page.

3. Modification Example

[Threshold Setting]

While the above-described embodiment assumes a configuration in which two types of thresholds (TH_PASS and TH_BAD_PAGE) are read from the OTP memory 360 at the time of start-up of the memory 300 (step S979 and S982), it is allowable to set the threshold with other methods.

That is, it is allowable to configure such that a plurality of sets of thresholds is recorded on the OTP memory 360 and that any one set is selected and used by the storage control apparatus 200. For example, it is assumed that three sets of two types of thresholds (TH_PASS and TH_BAD_PAGE) are recorded in the OTP memory 360 of the memory 300. Each of the three sets of thresholds respectively corresponds to each of early, middle, and late stages as a memory usage state over time. The storage control apparatus 200 reads the three sets of two types of thresholds from the memory 300 at the time of start-up of a memory system, selects one set of thresholds from among the three sets by parameter such as total start-up time and the total number of times of writing counted within the storage control apparatus 200, and sets the selected threshold onto the memory 300. Alternatively, it is also allowable to configure such that a parameter to specify any of the three sets of threshold groups (early, middle, or late stages) is set to the memory 300 without performing read or setting of the threshold.

Moreover, it is also allowable to record a predetermined identifier such as a manufacturing lot number of the memory 300 onto the OTP memory 360 and to decide the threshold on the basis of this. As for a driver for treating a memory system on the host computer 100, information indicating a combination of the predetermined identifier and the threshold is previously obtained using a method such as internet connection. The host computer 100 supplies the combination information to the storage control apparatus 200 at the time of start-up of the storage control apparatus 200. The storage control apparatus 200 reads a lot number from the memory 300 at the time of start-up of the memory system and checks this against the combination information, thereby selecting an appropriate threshold and sets it onto the memory 300.

[Judgment Condition for Number of Errors]

In the above-described embodiment, comparison with the threshold (TH_PASS) is performed using the sum of the number of set errors and the number of reset errors (step S979). They may be, however, treated as different conditions. In this modification example, the condition of step S979 is determined as 'number of set errors<threshold TH_PASS_SET' and 'number of reset errors<threshold TH_PASS_RESET'. In this case, the control unit 380 compares the number of set errors generated in step S976 with its threshold TH_PASS_SET while comparing the number of reset errors generated in step S978 with its threshold TH_PASS_RESET. In a case where both 'number of set errors<threshold TH_PASS_SET' and 'number of set errors<threshold TH_PASS_RESET' are true (step S979: Yes), processing proceeds to step S983. Moreover, at least one of 'number of set errors<threshold TH_PASS_SET' and 'number of set errors<threshold TH_PASS_RESET' is not true (step S979: No), processing proceeds to step S981.

[Weighted Sum of Number of Errors]

In the above-described embodiment, comparison against threshold (TH_PASS) is performed using the sum of the number of set errors and the number of reset errors (step S979), and at that time, weights of both are treated equally. In contrast, by performing addition of both with different weights, it is possible to change sensitivity of the number of set errors and the number of reset errors. In this modification example, the condition of step S979 is determined as 'number of set errors×2+number of set errors<threshold TH_PASS'. The control unit 380 adds the number of reset errors generated in step S978 to the double the number of set errors generated in step S976, and confirms (step S979) whether the sum is below the predetermined threshold (TH_PASS). In a case where the sum is below the threshold (step S979: Yes), the processing proceeds to step S983, and in a case where the sum is the threshold or above (step S979: No), the processing proceeds to step S981.

[Subdividing Defective Page Notification]

In the above-described embodiment, in a case where the number of reset errors is the predetermined threshold (TH_BAD_PAGE) or above, the notification of the occurrence of the defective page is sent to the storage control apparatus 200. By subdividing the threshold into two stages and sending two types of notifications of 'defective page determination', it is possible to send more specific notifications as described below.

For example, two thresholds TH_BAD_PAGE1 and TH_BAD_PAGE2 (TH_BAD_PAGE1<TH_BAD_PAGE2) are prepared in advance. In a case where the passage of the loop is the third passage in step S981, that is, in a case where the standard of step S979 has not been satisfied with three times of write attempts (step S981: Yes), the following processing is performed.

First, in a case where 'TH_BAD_PAGE2≤the number of reset errors' is satisfied, a notification of 'occurrence of defective page' is sent to the storage control apparatus 200. This notification is similar to the case of step S984. Moreover, in another case where 'number of reset errors<TH_BAD_PAGE1' is satisfied, a notification of 'writing error' is issued. This notification is similar to the case of step S985. In contrast, in still another case where 'TH_BAD_PAGE1≤the number of reset errors<TH_BAD_PAGE2' is satisfied, a notification of 'defective page alert' is sent to the storage control apparatus 200. This notification is unique to the present modification example.

By issuing the notification of 'defective page alert', the storage control apparatus 200 can perform control of arranging data with less rewriting (cold data) onto the corresponding data, or the like.

[Comparison with Write Data]

In the above-described embodiment, the data that have been read are compared with the bit pattern (set mask) to undergo the set operation (step S976), while the data that have been read are compared with the bit pattern (reset mask) to undergo the reset operation (step S978). As described below, it is also possible to use the data to be written, as such a comparison.

That is, the control unit 380 compares, in step S976, the data that have been read with write data to be written and decides a bit pattern to undergo the set operation similarly to step S974, and updates the set mask. Furthermore, the number of '1' that constitutes the set mask is counted and temporarily retained as the number of set errors. Moreover, the control unit 380 compares, in step S978, the data that have been read with write data to be written and decides a bit pattern to undergo the reset operation similarly to step S974, and updates the reset mask. Furthermore, the number of '1' that constitutes the reset mask is counted and temporarily retained as the number of reset errors.

[Defective Page Judgment at Erase Request]

While the above-described embodiment focuses on the error that occurs when the memory 300 processes the write request instructed by the storage control apparatus 200, herein, it is assumed that an erase request is provided other than the write request. The erase request is a request for writing '0' to all the bits of the designated physical address. It is preferable that the erase request has a threshold smaller than the threshold of the write request and thereby making it possible to make the judgment of the defective page on the erase request more strict. That is because, unlike the write request, it is conceivable that, in the case of the erase request, it is better to be easily judged to be a defective page with a lower standard, in that the erase request implies an aspect of preparing for the future recording.

Note that the above-described embodiments are examples for embodying the present technology, and matters in the embodiments each have a corresponding relationship with disclosure-specific matters in the claims. Similarly, the disclosure-specific matters in the claims and the matters in the embodiments of the present technology, denoted by the same names, have a corresponding relationship with each other. However, the present technology is not limited to the embodiments, and various modifications of the embodiments may be embodied in the scope of the present technology without departing from the spirit of the present technology.

Moreover, the processing procedures that are described in the embodiments described above may be handled as a method having a series of procedures or may be handled as a program for causing a computer to execute the series of procedures and recording medium storing the program. The exemplary recording media that can be used include a compact disc (CD), a mini disc (MD), and a digital versatile disk (DVD), a memory card, and a Blu-ray disc (registered trademark).

Note that effects described herein are provided for purposes of exemplary illustration and are not intended to be limiting. Still other effects may also be contemplated.

Note that the present technology may also be configured as below.

(1) A storage control apparatus including a determination unit configured to determine a unit-of-storage in which the number of errors in predetermined one of a reset operation and a set operation of a non-volatile memory toward a memory cell has exceeded a predetermined standard, as a unit-of-storage suspected of having a defect.

(2) The storage control apparatus according to (1), in which the determination unit determines a unit-of-storage in which a total value of the number of errors in the reset operation and the number of errors in the set operation has exceeded a predetermined standard and the number of errors in the predetermined one of the operations has exceeded a predetermined standard, as a unit-of-storage suspected of having a defect.

(3) The storage control apparatus according to (1), in which the determination unit determines a unit-of-storage in which a total value of the number of errors in the reset operation and the number of errors in the set operation has exceeded a predetermined standard by predetermined times and the number of errors in the predetermined one of the operations at the last time of the predetermined number of times has exceeded a predetermined standard, as a unit-of-storage suspected of having a defect.

(4) The storage control apparatus according to (1), in which the determination unit determines that a writing error has occurred in a unit-of-storage in a case where a total value of the number of errors in the reset operation and the number of errors in the set operation has exceeded a predetermined standard and the number of errors in the predetermined one of the operations has not exceeded a predetermined standard.

(5) The storage control apparatus according to (1), in which the determination unit determines the unit-of-storage suspected of having a defect as an unavailable unit-of-storage.

(6) The storage control apparatus according to any of (1) to (5), further including a management unit configured to reconfirm the unit-of-storage determined as a unit-of-storage suspected of having a defect and to manage the unit-of-storage, in accordance with the result, as an unavailable unit-of-storage.

(7) The storage control apparatus according to (6), in which, at the time of performing the reconfirmation, in a case where writing is performed again toward the unit-of-storage and the unit-of-storage is determined again as a unit-of-storage suspected of having a defect, the management unit manages the unit-of-storage as an unavailable unit-of-storage.

(8) The storage control apparatus according to (6) or (7), in which, the management unit performs the reconfirmation toward the unit-of-storage when the number of unit-of-storage determined as a unit-of-storage suspected of having a defect has exceeded a fixed number.

(9) The storage control apparatus according to any of (6) or (8), in which, when the management unit performs the reconfirmation, the determination unit determines a unit-of-storage in which the number of errors in the predetermined one of the operations has exceeded a standard higher than the predetermined standard, as the unit-of-storage suspected of having a defect.

(10) The storage control apparatus according to any of (6) or (9), in which the determination unit selects the predetermined standard for the number of errors in the predetermined one of the operations, from among a plurality of candidates.

(11) The storage control apparatus according to (10), in which the determination unit selects the predetermined standard from among the plurality of candidates in accordance with a state over time in which the non-volatile memory is used.

(12) The storage control apparatus according to (10), in which the determination unit selects the predetermined standard from among the plurality of candidates in accordance with a predetermined identifier of the non-volatile memory.

(13) The storage control apparatus according to (1), in which the determination unit determines a unit-of-storage in which each of the number of errors in the reset operation and the number of errors in the set operation has exceeded a predetermined standard and the number of errors in the predetermined one of the operations has exceeded a predetermined standard, as a unit-of-storage suspected of having a defect.

(14) The storage control apparatus according to (1), in which the determination unit determines a unit-of-storage in which a weighted sum of the number of errors in the reset operation and the number of errors in the set operation has exceeded a predetermined standard and the number of errors in the predetermined one of the operations has exceeded a predetermined standard, as a unit-of-storage suspected of having a defect.

(15) The storage control apparatus according to (1), in which, when the number of errors in the predetermined one of the operations is in a fixed state not exceeding the predetermined standard, the determination unit determines the unit-of-storage as a unit-of-storage having a possibility of transitioning to a unit-of-storage suspected of having a defect.

(16) The storage control apparatus according to (1), in which, when the determination unit processes an erase request of erasing all bits in a unit-of-storage, the determination unit determines the unit-of-storage as the unit-of-storage suspected of having a defect in a case where the number of errors in the predetermined one of the operations has exceeded a standard lower than the predetermined standard.

(17) A storage apparatus including: a memory cell formed with a non-volatile memory; and
a determination unit configured to determine a unit-of-storage in which the number of errors in predetermined one of a reset operation and a set operation toward the memory cell has exceeded a predetermined standard, as a unit-of-storage suspected of having a defect.

(18) The storage apparatus according to (17), further including a counter configured to count each of the number of errors in the reset operation and the number of errors in the set operation.

(19) A storage control method including:
a procedure of obtaining the number of errors in predetermined one of a reset operation and a set operation of a non-volatile memory toward a memory cell; and
a procedure of determining a unit-of-storage in which the number of errors in the predetermined one of the operations has exceeded a predetermined standard, as a unit-of-storage suspected of having a defect.

REFERENCE SIGNS LIST 100 host computer
200 storage control apparatus
210 host interface
230 memory interface
240 control unit
244 error page determination unit
245 page management unit
250 ROM
260 RAM
261 blank page table
270 ECC processing unit
290 bus
300 memory
310 control interface
320 word line decoder
330 memory cell
331 variable resistance element
333 plate
340 bit line selector
350 driver
360 OTP memory
380 control unit
381 error detection unit
382 reset error counter
383 set error counter
384 error page determination unit
390 bus

The invention claimed is:

1. A storage control apparatus, comprising:
circuitry configured to determine a unit-of-storage of a memory cell for a non-volatile memory as suspected of having a defect,
wherein the unit-of-storage is determined as suspected of having the defect based on a number of errors in one of a reset operation or a set operation of the non-volatile memory that exceeds a first threshold value and based on a total value of a number of errors in the reset operation and a number of errors in the set operation that exceeds a second threshold value.

2. The storage control apparatus according to claim 1, wherein the circuitry is further configured to determine the unit-of-storage as suspected of having the defect based on the total value of the number of errors in the reset operation and the number of errors in the set operation that exceeds the second threshold value by a determined number of times and based on the number of errors in the one of the reset operation or the set operation at a last time of the determined number of times that exceeds the first threshold value.

3. The storage control apparatus according to claim 1, wherein the circuitry is further configured to determine an occurrence of a writing error in the unit-of-storage based on the total value of the number of errors in the reset operation and the number of errors in the set operation that exceeds the second threshold value and based on the number of errors in the one of the set operation or the reset operation that is lower than the first threshold value.

4. The storage control apparatus according to claim 1, wherein the circuitry is further configured to determine the unit-of-storage suspected of having the defect as an unavailable unit-of-storage.

5. The storage control apparatus according to claim 1, wherein the circuitry is further configured to:
reconfirm the unit-of-storage determined as suspected of having the defect; and
manage the unit-of-storage as an unavailable unit-of-storage based on the reconfirmation of the unit-of-storage.

6. The storage control apparatus according to claim 5, wherein, at a time of the reconfirmation, based on writing performed again toward the unit-of-storage and the unit-of-storage determined again as suspected of having the defect, the circuitry is further configured to manage the unit-of-storage as the unavailable unit-of-storage.

7. The storage control apparatus according to claim 5, wherein the circuitry further is configured to reconfirm the unit-of-storage based on a number of the unit-of-storage determined as suspected of having the defect that exceeds a fixed number.

8. The storage control apparatus according to claim 5, wherein based on the reconfirmation, the circuitry is further configured to determine the unit-of-storage as suspected of having the defect based on the number of errors in the one of the set operation or the reset operation that exceeds a third threshold value which is higher than the first threshold value.

9. The storage control apparatus according to claim 1, wherein the circuitry is further configured to select the first threshold value for the number of errors in the one of the set operation or the reset operation from a plurality of candidates.

10. The storage control apparatus according to claim 9, wherein the circuitry is configured to select the first threshold value from the plurality of candidates based on a usage state over time in which the non-volatile memory is used.

11. The storage control apparatus according to claim 9, wherein the circuitry is further configured to select the first threshold value from the plurality of candidates based on an identifier of the non-volatile memory.

12. The storage control apparatus according to claim 1, wherein the circuitry is further configured to determine the unit-of-storage as suspected of having the defect based on a weighted sum of the number of errors in the reset operation and the number of errors in the set operation that exceeds the second threshold value and the number of errors in the one of the set operation or the reset operation that exceeds the first threshold value.

13. The storage control apparatus according to claim 1, wherein, based on the number of errors in the one of the set operation or the reset operation that is in a fixed state lower than or equal to the first threshold value, the circuitry is further configured to determine that the unit-of-storage has a possibility to transition to become suspect of having the defect.

14. The storage control apparatus according to claim 1, wherein, based on an erase request to erase all bits in the unit-of-storage, the circuitry is further configured to determine the unit-of-storage as suspected of having the defect based on the number of errors in the one of the set operation or the reset operation that exceeds a fourth threshold value which is lower than the first threshold value.

15. A storage apparatus, comprising:
a unit-of-storage of a memory cell for a non-volatile memory; and
circuitry configured to determine the unit-of-storage as suspected of having a defect based on a number of errors in one of a reset operation or a set operation of the memory cell that exceeds first threshold value and based on a total value of a number of errors in the reset operation and a number of errors in the set operation that exceeds a second threshold value.

16. The storage apparatus according to claim 15, further comprising a counter configured to count each of the number of errors in the reset operation and the number of errors in the set operation.

17. A storage control method, comprising:
obtaining a number of errors in one of a reset operation or a set operation of a memory cell for a non-volatile memory; and
determining a unit-of-storage of the memory cell as suspected of having a defect based on the number of errors in the one of the set operation or the reset operation that exceeds a first threshold value and based on a total value of a number of errors in the reset operation and a number of errors in the set operation that exceeds a second threshold value.

18. A storage control apparatus, comprising:
circuitry configured to:
determine a unit-of-storage of a memory cell for a non-volatile memory as suspected of having a defect based on a number of errors in one of a reset operation or a set operation of the non-volatile memory that exceeds a threshold value; and
select the threshold value for the number of errors in the one of the set operation or the reset operation from a plurality of candidates.

19. A storage control apparatus, comprising:
circuitry configured to:
determine a unit-of-storage of a memory cell for a non-volatile memory as suspected of having a defect based on a number of errors in one of a reset operation or a set operation of the non-volatile memory that exceeds a threshold value;
reconfirm the unit-of-storage determined as suspected of having the defect; and
manage the unit-of-storage as an unavailable unit-of-storage based on the reconfirmation of the unit-of-storage.

* * * * *